United States Patent [19]
Zagar et al.

[11] Patent Number: 5,311,478
[45] Date of Patent: May 10, 1994

[54] INTEGRATED CIRCUIT MEMORY WITH ASYMMETRIC ROW ACCESS TOPOLOGY

[75] Inventors: Paul S. Zagar; Loren L. McLaury, both of Boise, Id.

[73] Assignee: Micron Technology, Inc., Boise, Id.

[21] Appl. No.: 931,590

[22] Filed: Aug. 18, 1992

[51] Int. Cl.$^5$ .............................................. G11C 7/00
[52] U.S. Cl. ......................... 365/230.06; 365/189.01; 365/206; 365/221
[58] Field of Search ................... 365/230.06, 206, 221, 365/189.06, 230.06, 206, 221, 203, 222, 233, 189.01

[56] References Cited
U.S. PATENT DOCUMENTS

| | | | |
|---|---|---|---|
| 4,636,987 | 1/1987 | Norwood et al. | 365/208 |
| 5,018,110 | 5/1991 | Sugiyama et al. | 365/221 |
| 5,053,997 | 10/1991 | Miyamato et al. | 365/206 |

Primary Examiner—Eugene R. LaRoche
Assistant Examiner—Huan Hoang
Attorney, Agent, or Firm—Dorr, Carson, Sloan & Peterson

[57] ABSTRACT

A DRAM or VRAM integrated circuit memory of the divided bit line design includes a first bit line pair divided into a first pair of bit line halves and a second pair of bit line halves, and second bit line pair divided into a third pair of bit line halves and a fourth pair of bit line halves. A row decoder addresses a row associated with the first pair of bit line halves during a first time period, addresses a row associated with the second pair of bit line halves in a second time period, addresses a row associated with the third pair of bit line halves in the first time period, and addresses a row associated with the fourth pair of bit line halves in the second time period. The access topology is thus asymmetric with respect to a column decoder connected to the second and third pairs of bit line halves.

24 Claims, 12 Drawing Sheets

DRAM ACCESS CYCLE

DRAM ACCESS CYCLE

REFRESH CYCLE

VRAM ACCESS CYCLE

DRAM ACCESS CYCLES

REFRESH CYCLES

VRAM ACCESS CYCLES

INTEGRATED CIRCUIT MEMORY WITH ASYMMETRIC ROW ACCESS TOPOLOGY

BACKGROUND OF THE INVENTION

1. Field of the Invention:

The invention in general relates to integrated circuit memory arrays and more particularly with the row access topology of such memory arrays.

2. Statement of the Problem:

Integrated Circuit memories generally contain a two dimensional array of storage cells arranged in rows and columns. A common architecture is to connect all cells in a row to a common row line, often referred to as the "word line" and all cells in a column to a common column line often called the "bit line" or "digit line". In this architecture, the row line provides a signal which enables cells to receive or output a data signal and the column line provides the input or output line on which the signal is transferred. An individual cell is addressed via a row decoder that selects a row to be addressed and a column decoder which selects a column to be addressed, thereby selecting one particular cell at the corresponding row and column location. The cell is accessed by placing an enable signal on the row line in the row associated with the cell and reading or writing a signal on the column line associated with the cell.

Integrated circuit memories are also generally binary logic circuits in which information is stored and transferred as voltages representing complementary logic values that are alternately referred to as "true and false", "logic 1 and logic 0", or "logic high and logic low". Typically a voltage of 5 volts may represent the logic 1 state while a voltage of zero volts represents the logic 0 state. Because of the constraints of resistance, capacitance etc. the individual voltages input to or output on the column lines by individual cells are usually at some intermediate voltage. Thus subcircuits are associated with the column lines of integrated circuit memories to pull the high voltage values up to, or as close as possible to, the full logic 1 voltage, for example 5 volts, and to pull the low voltages down to as close to the logic 0 voltage, for example 0 volts, as possible. These subcircuits are commonly referred to as sense amplifiers. A common architecture utilizes a separate pull down subcircuit, referred to as an N-sense amplifier, to pull the low signals down to the logic 0 voltage, and a separate pull up subcircuit, referred to as a P-sense amplifier, to pull the high voltages up to the logic 1 voltage.

The invention to be disclosed herein is particularly applicable to an architecture used in dynamic random access memories (DRAM) and video random access memories (VRAM). In this architecture the individual memory cell comprises a transistor and a capacitor connected in series. One side of the capacitor is connected to a reference voltage, and the other side is connected to the column line through the transistor. The gate of the transistor is connected to the row line. Information is stored in the form of charge on the capacitor, which charge is input and output via the column line and gated by the row line acting on the transistor gate. There are tens or even hundreds of such cells connected to each column line. The column lines are organized into pairs with one N-sense amplifier and one P-sense amplifier associated with each pair. The N-sense amplifiers and P-sense amplifiers are connected across the pairs, with one column line going low and the other going high when one of the pairs of lines is addressed. The attachment of the transistor gates to row lines is staggered with the cells associated with adjacent pairs of column lines belonging to different rows so that the transistor which gates one of each associated pair will be off when a cell on the other of the pair is being addressed. That is, when a particular cell is addressed, the column line it is attached to will go high or low, depending on the cells content; the other column line or the pair will go to the opposite logic value. When the read or write cycle is over, the pairs are shorted together, which quickly brings them to a mid-voltage level, resetting them for the next cycle. In this way the pairing of the lines results in faster cycling of the circuit as a whole. Since the connection of the cells to the row lines are staggered, the transistor gates associated with the one of the line pair that is not being addressed are always off and the information in the cells is not affected by the column line of the non-addressed cells going high or low. This architecture is referred to as "divided bit line sensing". A common arrangement of the various parts of the circuit in the divided bit line sensing approach is to locate the column decoder and DRAM input and output terminals at one end of the column lines, the P-sense amplifiers at the other end of the column lines, and the N-sense amplifiers at the center of the column lines thereby dividing each the column lines into two halves, one half of the line extending between the N-sense amplifier and the column decoder and the other half extending between the N-sense amplifier and the P-sense amplifier. In VRAM a sequential-access memory (SAM) port is connected to the column lines on the opposite side of the P-sense amplifier from the column decoder.

As is well-known, integrated circuit memories are generally mass produced by fabricating hundreds of identical circuit patterns on a single semiconducting wafer, which wafer is subsequently sawed into hundreds of identical dies or chips. The advantages of building integrated circuits with smaller individual circuit elements so that more and more circuitry may be packed on a single chip are well-known: electronic equipment becomes less bulky, reliability is improved by reducing the number of solder or plug connections, assembly and packaging costs are minimized, and improved circuit performance, in particular higher clock speeds. However, the smaller the size of the individual cell, the smaller the size of the individual electrical components in the cell, and the smaller the electrical signals associated with them. As more and more individual storage cells are placed onto a single chip, the length of the column lines connecting the individual cells to the amplifiers becomes longer and longer as compared to the individual cell size, and the capacitance associated with the lines becomes larger. This means that the signal transferred to the column line from an individual cell will become even smaller as the capacitance of the line absorbs the charge, and further that the time for developing a useful signal level on the line may increase. As is well known, speed is an important factor in such memories, since the faster the cells can be read, the faster is the computer of which the memory is a part, and the more operations the computer can do. Thus a number of enhancements have been made to DRAM and VRAM architecture to increase the signal level and amplifier response time. One such enhancement is described in U.S. Pat. No. 4,636,987. This patent describes an architecture in which a single column decoder is shared by four arrays, two arrays on either side of the column decoder. The row within the arrays are accessed symmetrically with respect to the column decoder: that is, a row in each of the arrays proximal to the column decoder are accessed in one access cycle, and a row in each of the arrays distal to the column decoder are accessed in a second access cycle. This access topology and related circuit design aspects provides a voltage doubling at the N-sense amplifiers and some convenience of design, but when further improvements described herein are added, it also results in uneven power use by the circuit. That is, as shall be seen in the detailed description below, when the circuit is accessing the arrays distal from the column decoder it generally draws more power than when it is accessing the arrays proximal to the column decoder. Such uneven power requirements means that the circuit power carrying capability must either be over-designed for the lower power cycles or under-designed for the higher power cycles, the first of which is wasteful and the second of which can result in decreased reliability and increased defects. Thus there is a need for a DRAM and VRAM architecture that allows the voltage doubling at the N-sense amplifiers and the improvements described below and at the same time has uniform power requirements in all access cycles.

For many applications of integrated circuit memories, such as for portable computers and other battery powered intelligent devices, the amount of power available is limited. Thus it is important that sense amplifiers not only are fast and small, but also consume a minimum of power. The largest component of the total power used in DRAM's is the charging and discharging of the column lines. Since all bits on the selected row line during an access must be refreshed, all the column lines must be charged or discharged. In the prior art, the entire column line had to be charged or discharged in every access. Therefore there is a need for an integrated circuit memory design in which this charging and discharging of digit lines is limited. In sum, it would be highly desirable to have an integrated circuit memory architecture that not only has uniform power requirements in all access cycles, but also decreases the maximum power consumed by the memory circuit. 3. Solution to the problem:

The present invention solves the above problems by providing a row access topology that is asymmetric with respect to the circuit input/output.

In DRAM, where the input/output port is associated with column decoder, one array distal from the column decoder is accessed in the same cycle as an array proximal from the column decoder. In VRAM, where the input/output port is associated with the SAM, one array distal from the SAM is accessed in the same cycle as an array proximal to the SAM.

The above-described asymmetrical access topology results in equal power requirements in all access cycles whether DRAM or VRAM is used.

Further, the timing signal which turns the isolation transistors on and off is altered from the prior art. The isolation transistors are controlled so that, in DRAM and VRAM, when the row being addressed is on the side of the N-sense amplifier nearer the input and outputs, the column line pair halves that are farther from the input and outputs are isolated from the N-sense amplifier during the both the N-sense and P-sense periods. That is, in DRAM, when the row being addressed is on the column decoder side of the N-sense amplifier, the isolation transistors on the SAM side of the N-sense amplifier remain off during both the N-sense and P-sense phases of the cycle, while in VRAM, when the row being addressed is on the SAM side of the N-sense amplifier, the isolation transistors on the column decoder side of the N-sense amplifier remain off during both the N-sense and P-sense periods. During the refresh cycle, the isolation transistors on the opposite side of the N-sense amplifier from the row being addressed remains off during both the N-sense and P-sense periods.

Further, the actuation of the individual P-sense amplifiers is controlled by a timing signal so that the P-sense amplifiers associated with the column line pair halves that are isolated from the inputs/outputs during the P-sense cycle do not fire, thus not charging the associated column line halves and saving power.

SUMMARY OF THE INVENTION

The invention provides an integrated circuit memory comprising: an array of memory cells arranged in a plurality of rows and columns; a first column line connecting cells in a column, the first column line divided into a first column line portion and a second column line portion; a second column line connecting cells in a column, the second column line divided into a third column line portion and a fourth column line portion; input/output means for connecting the column lines to a circuit external of the memory array; a plurality of row lines, each row line connecting cells in a row; row access means for providing a signal defining a first row access cycle and a second row access cycle; timing signal generator means for providing one or more amplifier timing signals; row decoder means responsive to the row access signal for addressing a row connected to a cell connected to the first column line portion during the first row access cycle, for addressing a row connected to a cell connected to the second column line portion in the second row access cycle, for addressing a row connected to a cell connected to the third column line portion during the first row access cycle and for addressing a row connected to a cell connected to the fourth column line portion during the second cycle; and first amplifier means responsive to one of the amplifier timing signals for amplifying a signal from a cell connected to the first column line portion during the first row access cycle and for amplifying a signal from a cell connected to the second column line portion during the second row access cycle, the first amplifier means drawing a first amount of power when amplifying the signal associated with the first column line portion and a second amount of power different from the first amount of power when amplifying a signal from the second column line portion; second amplifier means responsive to one of the amplifier timing signals for amplifying a signal from a cell connected to the third column line portion during the first row access cycle and for amplifying a signal from a cell connected to the fourth column line portion during the second row access cycle, the second amplifier means drawing the second amount of power when amplifying a signal associated with the third column line portion and drawing the first amount of power when amplifying a signal associated with the fourth column line portion. Preferably, the first amplifier means comprises a first N-sense amplifier and first isolation means for alternatively isolating the first N-sense amplifier from each of the first column line portion and the second column line portion; and the second amplifier means comprises a second N-sense amplifier and second isolation means for alternatively isolating the second N-sense amplifier from each of the third column line portion and the fourth column line portion. In one embodiment, the first amplifier means further comprises a first P-sense amplifier connected to the first column line portion and a second P-sense amplifier connected to the second column line portion; and the second amplifier means further comprises a third P-sense amplifier connected to the third column line portion and a fourth P-sense amplifier connected to the fourth column line portion. In another embodiment the first isolation means comprises a first isolation transistor connecting the first N-sense amplifier to the first column line portion and a second isolation transistor connecting the first N-sense amplifier to the second column line portion; the second isolation means comprises a third isolation transistor connecting the second N-sense amplifier to the third column line portion and a fourth isolation transistor connecting the second N-sense amplifier to the fourth column line portion; the first amplifier means further comprises a first P-sense amplifier connected to the first column line between the first isolation transistor and the second isolation transistor; and the second amplifier means further comprises a second P-sense amplifier connected to the second column line between the third isolation transistor and the fourth isolation transistor. Preferably, the input/output means is connected to the second column line portion and to the third column line portion. Alternatively, the input/output means comprises a first SAM connected to the first column line portion and a second SAM connected to the fourth column line portion. Preferably, there are a plurality of the first and second column lines, each first column line is divided into a first column line portion and a second column line portion, each second column line is divided into a third column line portion and a fourth column line portion, the input/output means comprises a column decoder connected to each of the second column line portions and each of the third column line portions, each first column line has associated with it one of the first amplifier means, and each second column line has associated with it one of the second amplifier means.

In another aspect, the invention provides an integrated circuit memory comprising: an array of memory cells arranged in a plurality of rows and at least one column; a first column line connecting cells in a column, the first column line divided into a first column line portion and a second column line portion; a second column line connecting cells in a column, the second column line divided into a third column line portion and a fourth column line portion; input/output means for connecting the first and second column lines to a circuit external of the memory array, the input/output means connected to the second column line portion and to the third column line portion; a plurality of row lines, each row line connecting cells in a row; row access means for providing a signal defining a first row access cycle and a second row access cycle; timing signal generator means for providing one or more isolation timing signals; row decoder means responsive to the row access signal for addressing a row connected to a cell connected to the first column line portion during the first row access cycle, for addressing a row connected to a cell connected to the second column line portion in the second row access cycle, for addressing a row connected to a cell connected to the third column line portion during the first row access cycle, and for addressing a row connected to a cell connected to the fourth column line portion during the second row access cycle; a first N-sense amplifier connected to the first column line; a second N-sense amplifier connected to the second column line; first isolating means responsive to the one of the isolation timing signals for isolating the first N-sense amplifier from the first column line portion during at least a portion of the second row access cycle, the first N-sense amplifier connected to the first column line portion through the first isolating means; second isolating means responsive to one of the isolation timing signals for isolating the first N-sense amplifier from the second column line portion during at least a portion of the first row access cycle, the first N-sense amplifier connected to the second column line portion through the second isolating means; third isolating means responsive one of the isolation timing signals for isolating the second N-sense amplifier from the third column line portion during at least a portion of the second row access cycle, the second N-sense amplifier connected to the third column line portion through the third isolating means; and fourth isolating means responsive to one of the isolation timing signals for isolating the second N-sense amplifier from the fourth column line portion during at least a portion of the first row access cycle the second N-sense amplifier connected to the fourth column line portion through the fourth isolating means. In one embodiment, the invention further comprises: a first P-sense amplifier connected to the first column line portion; a second P-sense amplifier connected to the second column line portion; a third P-sense amplifier connected to the third column line portion; and a fourth P-sense amplifier connected to the fourth column line portion; and wherein: the first isolating means comprises means for isolating the second P-sense amplifier from the first column line portion during at least a portion of the second row access cycle; and the fourth isolating means comprises means for isolating the third P-sense amplifier from the fourth column line portion during at least a portion of the first row access cycle.

In a further aspect, the invention provides an integrated circuit memory comprising: an array of memory cells arranged in a plurality of rows and columns; a first column line pair comprising a first column line connecting cells in one column and a second column line connecting cells in an adjacent column, the first column line pair divided into a first pair of column line halves and a second pair of column line halves; a second column line pair comprising a third column line connecting cells in one column and a fourth column line connecting cells in an adjacent column, the second column line pair divided into a third pair of column line halves and a fourth pair of column line halves; input/output means for connecting the column line pairs to a circuit external of the memory array; a plurality of row lines, each row line connecting cells in a row; row access means for providing a signal defining a first row access cycle and a second row access cycle; timing signal generator means for providing one or more amplifier timing signals; row decoder means responsive to the row access signal for addressing a row connected to a cell connected to the first pair of column line halves during the first row access cycle, for addressing a row connected to a cell connected to the second pair of column line halves during the second row access cycle, for addressing a row connected to a cell connected to the third pair of column line halves during the first row access cycle, and for addressing a row connected to a cell connected to the fourth pair of column line halves during the second row access cycle; and first amplifier means responsive to one of the amplifier timing signals for amplifying a signal from a cell connected to the first pair of column line halves during the first row access cycle and for amplifying a signal from a cell connected to the second pair of column line halves during the second row access cycle, the first amplifier means drawing a first amount of power when amplifying the signal associated with the first pair of column line halves and a second amount of power different from the first amount of power when amplifying a signal from the second pair of column line halves; second amplifier means responsive to one of the amplifier timing signals for amplifying a signal from a cell connected to the third pair of oolumn line halves during the first row access cycle and for amplifying a signal from a cell connected to the fourth pair of column line halves during the second row access cycle, the second amplifier means drawing the second amount of power when amplifying a signal associated with the third pair of column line halves and drawing the first amount of power when amplifying a signal associated with the fourth pair of column line halves. Preferably, the first amplifier means comprises a first N-sense amplifier and first isolation means for alternatively isolating the first N-sense amplifier from each of the first and second pair of column line halves of the first column line pair; and the second amplifier means comprises a second N-sense amplifier and second isolation means for alternatively isolating the second N-sense amplifier from each of the third and fourth pair of column line halves of the second column line pair. In one embodiment, the first amplifier means further comprises a first P-sense amplifier connected to the first pair of column line halves and a second P-sense amplifier connected to the second pair of column line halves; and the second amplifier means further comprises a third P-sense amplifier connected to the third pair of column line halves and a fourth P-sense amplifier connected to the fourth pair of column line halves. In another embodiment the first isolation means comprises a first pair of isolation transistors connecting the first N-sense amplifier to the first pair of column line halves, a second pair of isolation transistors connecting the first N-sense amplifier to the second pair of column line halves; the second isolation means comprises a third pair of isolation transistors connecting the second N-sense amplifier to the third pair of column line halves, and a fourth pair of isolation transistors connecting the second N-sense amplifier to the fourth pair of column line halves; the first amplifier means further comprises a first P-sense amplifier connected across the first column line pair between the first pair of isolation transistors and the second pair of isolation transistors; and the second amplifier means further comprises a second P-sense amplifier connected to the second column line pair between the third pair of isolation transistors and the fourth pair of isolation transistors. In one embodiment, the input/output means is connected to the second pair of column line halves and to the third pair of column line halves. Preferably, there are a plurality of the first and second column line pairs, each first column line pair is divided into a first pair of column line halves and a second pair of column line halves, each second column line pair is divided into a third pair of column line halves and fourth pair of column line halves, the input/output means comprises a column decoder connected to the second pair of column line halves of each first column line pair and the third pair of column line halves of each second column line pair, each first column line pair has associated with it one of the first amplifier means, and each second column line pair has associated with it one of the second amplifier means.

In still another aspect the invention provides an integrated circuit memory comprising: an array of memory cells arranged in a plurality of rows and at least one column; a first column line connecting cells in a column, said first column line divided into a first column line portion and a second column line portion; a second column line connecting cells in a column, said second column line divided into a third column line portion and a fourth column line portion; input/output means for connecting said first and second column lines to a circuit external of said memory array, said input/output means connected to said second column line portion and to said third column line portion; a plurality of row lines, each row line connecting cells in a row; row access means for providing a signal defining a first row access cycle and a second row access cycle; row decoder means responsive to said row access signal for addressing a row connected to a cell connected to said first column line portion during said first row access cycle, for addressing a row connected to a cell connected to said second column line portion in said second row access cycle, for addressing a row connected to a cell connected to said third column line portion during said first row access cycle, and for addressing a row connected to a cell connected to said fourth column line portion during said second row access cycle; a first P-sense amplifier connected to said first column line portion; a second P-sense amplifier connected to said second column line portion; a third P-sense amplifier connected to said third column line portion; a fourth P-sense amplifier connected to said fourth column line portion; timing signal generator means for providing a refresh timing signal defining a refresh period, a first P-sense timing signal defining a P-sense period during said first row access cycle, a second P-sense timing signal defining a P-sense period during said second row access cycle, and one or more isolation timing signals; first isolating means responsive to one of said isolation timing signals for isolating said first column line portion for said second column line portion during said P-sense period in said second row access cycle during said refresh period; second isolating means responsive to one of said isolation timing signals for isolating said second column line portion from said first column line portion during said P-sense period in said first row access cycle during said refresh period; third isolating means responsive to one of said isolation timing signals for isolating said third column line portion from said fourth column line portion during said P-sense period in said second row access cycle during said refresh period; and fourth isolating means responsive to one of said isolation timing signals for isolating said fourth column line portion from said third column line portion during said P-sense period in said first row access cycle during said refresh period. Preferably, the integrated circuit memory further comprises a first N-sense amplifier connected to said first column line between said first isolating means and said second isolating means and a second N-sense amplifier connected to said second column line between said third isolating means and said fourth isolating means.

In yet another aspect the invention provides an integrated circuit memory comprising: an array of memory cells arranged in a plurality of rows and at least one column; a first column line connecting cells in a column, said first column line divided into a first column line portion and a second column line portion; a second column line connecting cells in a column, said second column line divided into a third column line portion and a fourth column line portion; input/output means for connecting said first and second column lines to a circuit external of said memory array, said input/output means connected to said first column line portion and to said fourth column line portion; a plurality of row lines, each row line connecting cells in a row; row access means for providing a signal defining a first row access cycle and a second row access cycle; timing signal generator means for providing one or more isolation timing signals; row decoder means responsive to said row access signal for addressing a row connected to a cell connected to said first column line portion during said first row access cycle, for addressing a row connected to a cell connected to said second column line portion in said second row access cycle, for addressing a row connected to a cell connected to said third column line portion during said first row access cycle, and for addressing a row connected to a cell connected to said fourth column line portion during said second row access cycle; a first N-sense amplifier connected to said first column line; a second N-sense amplifier connected to said second column line; first isolating means responsive to said one of said isolation timing signals for isolating said first N-sense amplifier from said first column line portion during at least a portion of said second row access cycle, said first N-sense amplifier connected to said first column line portion through said first isolating means; second isolating means responsive to one of said isolation timing signals for isolating said first N-sense amplifier from said second column line portion during at least a portion of said first row access cycle, said first N-sense amplifier connected to said second column line portion through said second isolating means; third isolating means responsive one of said isolation timing signals for isolating said second N-sense amplifier from said third column line portion during at least a portion of said second row access cycle, said second N-sense amplifier connected to said third column line portion through said third isolating means; and fourth isolating means responsive to one of said isolation timing signals for isolating said second N-sense amplifier from said fourth column line portion during at least a portion of said first row access cycle said second N-sense amplifier connected to said fourth column line portion through said fourth isolating means. Preferably, the integrated circuit memory further comprises: a first P-sense amplifier connected to said first column line portion; a second P-sense amplifier connected to said second column line portion; a third P-sense amplifier connected to said third column line portion; and fourth P-sense amplifier connected to said fourth column line portion; and: said second isolating means comprises means for isolating said first P-sense amplifier from said second column line portion during at least a portion of said first row access cycle; and said third isolating means comprises means for isolating said fourth P-sense amplifier from said third column line portion during at least a portion of said second row access cycle.

The invention not only provides a memory access topology that results in even power requirements for all access cycles, but this result is generally independent of the amplification circuit. Thus it opens the way for power saving amplification circuits that could have caused unbalanced power requirements with the prior art topology. Numerous other features, objects and advantages of the invention will become apparent from the following description when read in conjunction with the accompanying drawings.

DESCRIPTION OF THE PREFERRED EMBODIMENT

1. Overview

Figure 1:
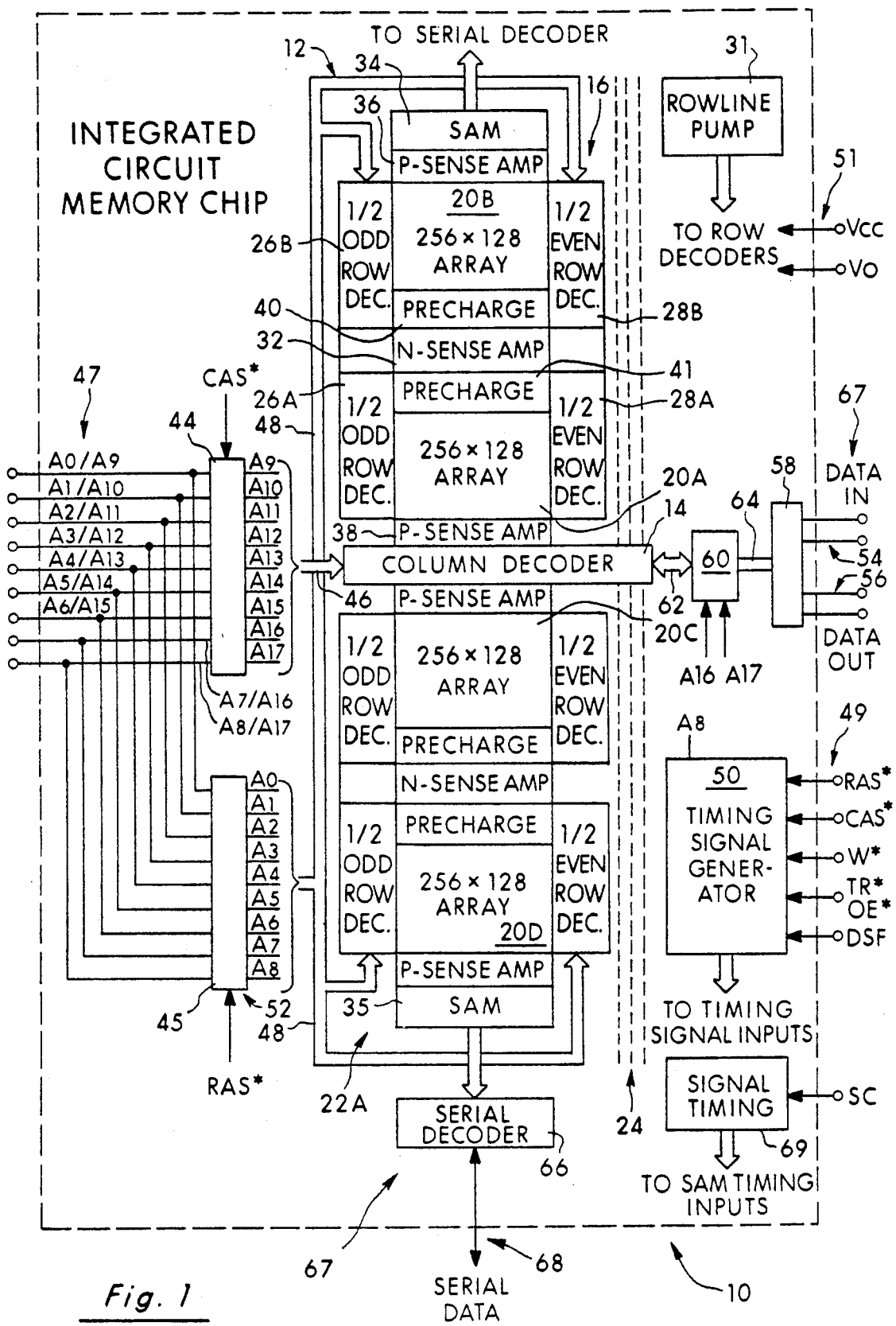
FIG. 1 is a block circuit schematic of an 512K integrated circuit memory according to a preferred embodiment of the invention.
Figure 2:
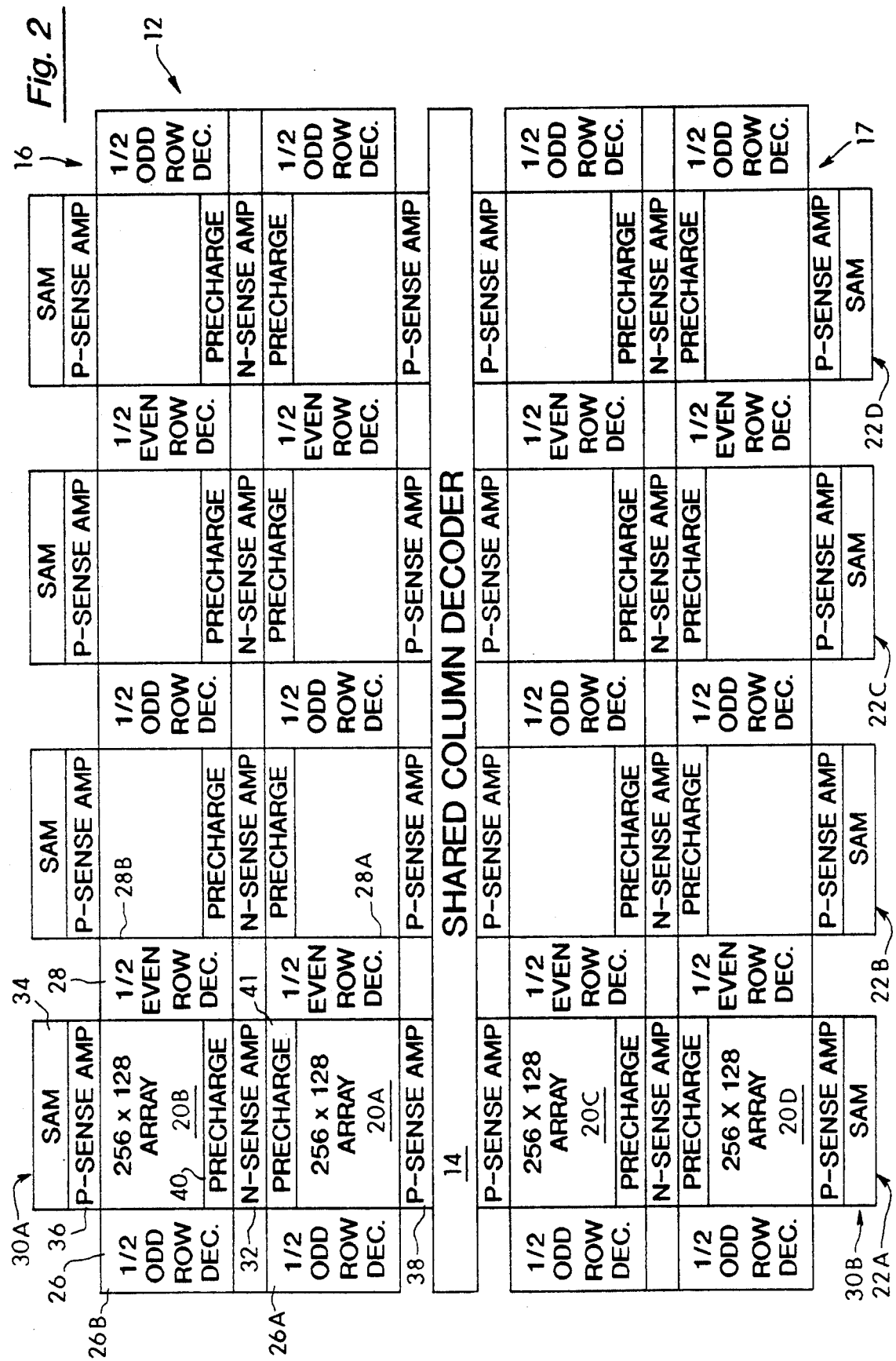
FIG. 2 is a block diagram illustrating the full array of the embodiment of FIG. 1.

Turning now to FIG. 1, there is shown an integrated circuit memory chip 10 according to the preferred embodiment of the invention. It should be understood that the particular embodiments described herein are exemplary, and are described in detail to more clearly and fully depict the invention than would otherwise be possible; they are not meant to limit the invention to these particular embodiments. The integrated circuit 10 comprises a memory circuit 12 which includes a column decoder 14, a row decoder 16, and a 1024×512 array 17 (FIG. 2) of memory cells 18 (FIG. 3), which array 17 is broken down into sixteen 256×128 smaller arrays 20. Because of space limitations, only one quadrant 22A including four arrays 20A, 20B, 20C, and 20D are shown in FIG. 1; three other quadrants 22C, 22C, and 22D (FIG. 2) are indicated by the three dotted lines 24 in FIG. 1. The full memory circuit 12 including sixteen arrays 20A, 20B, etc. is shown in FIG. 2. The full circuit 12 can be understood most easily if thought of as eight 512×128 arrays 30A, 30B, etc. each of Which includes two 256×128 arrays, such as 20A and 20B, an odd row decoder 26 which is separated into two halves 26A and 26B, an even row decoder 28 which is separated into two halves 28A and 28B, an N-sense amplifier region 32, a column decoder 14 at one end, a SAM (Serially Addressable Memory) region 34 at the other end, two P-sense amplifier regions 36 and 38, and two precharge circuit regions 40 and 41. Each of these 512×128 arrays 30A, 30B, etc. may also include other subcircuits, but these shall not be described as they are not directly related to the invention to be described. This particular embodiment selected to describe the invention is what is commonly known as a 512Kbit memory circuit in a 256K×2 architecture. As is well known in the art, a 512Kbit circuit actually has capacity for 524,288 bits which is equal to the 512×1024 cells.

The integrated circuit 10 is an 22 pin chip. Nine of the pins, indicated at 47, connect to the address buffers 44 and 45 which in a known manner use the CAS* and RAS* timing signals respectively to multiplex the incoming signals to output the row address signals A0 to A8 on lines 48 which connect to the row decoder 16, to output the column address signals A9 through 15 on lines 46 which connect to column decoder 14, and to output the column address signals A16 and A17 to a two-of-eight decoder 60. Row access means 52, comprises the inputs 47 and row buffer 45, and provides a key signal, A8, which is directed to both the row decoder 16 and the timing signal generator 50. The address signals A0 through A15 are used to access one cell in each of the eight 512×128 arrays 30A, 30B, etc. on each access cycle. The RAS*, CAS*, W*, TR*, OE*, and DSF signals are input on five of the pins, indicated at 49, to a timing signal generator means 50 while a serial clock signal, SC, is input on a sixth pin to a serial timing generator 69. Note that TR* and OE* are input to the same pin, as is common practice. Timing generators 50 and 69 use these signals, the A8 signal from row buffer 45, a conventional internal clock, and conventional logic circuitry to generate all the required timing signals required by chip 10. It is noted that it is possible that in some chips some signals input to the chip, such as the RAS* or CAS* signals, may pass directly to the circuitry that uses them, such as the row buffer 45 and the column buffer 44, respectively. In this case, the input pins on which these signals are input would be considered to be part of the timing signal generator means 50, 69. In other words, the term "timing signal generator means" is intended to be as broad as possible, and includes the sources of all the timing signals used on the chip. The timing signals are used by the chip circuitry, in a manner to be described in detail below. Another two of the pins, indicated by 51, are used to input the logic 1 voltage, $V_{cc}$, and the logic zero voltage, $V_0$. Another two pins 54 provide two lines of data input while two pins 56 provide two lines of data output. The final pin 68 provides the serial data input and output. Parallel input 54 and output 56 are connected to input/output buffer and control circuit 58. A two-of-eight decoder 60 utilizes the A16 and A17 signals from column buffer 44 to connect two of the eight pairs of input/output lines 62 coming from column decoder 14 to the dual line 64 which connects to the input/output buffer and control circuit 58. SAM regions 34 and 35 connect to serial decoder 66 which multiplexes the SAMs to the serial input and output lines 68 and 69 respectively. A row line pump circuit 31 connects to the row decoders 16 in a known manner.

The particular embodiment is what is generally known as a VRAM (Video Random Access Memory). A DRAM (Dynamic Random Access Memory) would be exactly the same except it would not include the SAM regions 34 and 35, the serial decoder 66, the serial input 68, and serial output 69. In the discussion below, in order to avoid the redundancy of separate drawings for DRAM circuits, we shall sometimes refer to a DRAM cycle in reference to FIGS. 1, 2, or another figure showing one or more SAMs. In such discussions of DRAM functions, it is intended that the SAMs would not function or otherwise be ignored, and all inputs and outputs would be via column decoder 14. As will be seen below, the input/output means 67 of the invention can be considered to be either the column decoder 14 together with the lines 62, decoder 60, control circuit 58, inputs 54 and outputs 56, or the SAMs together with serial decoder 66, input 68, and output 69, or any other input/output circuits used with integrated circuit memories.

Figures 8, 9:
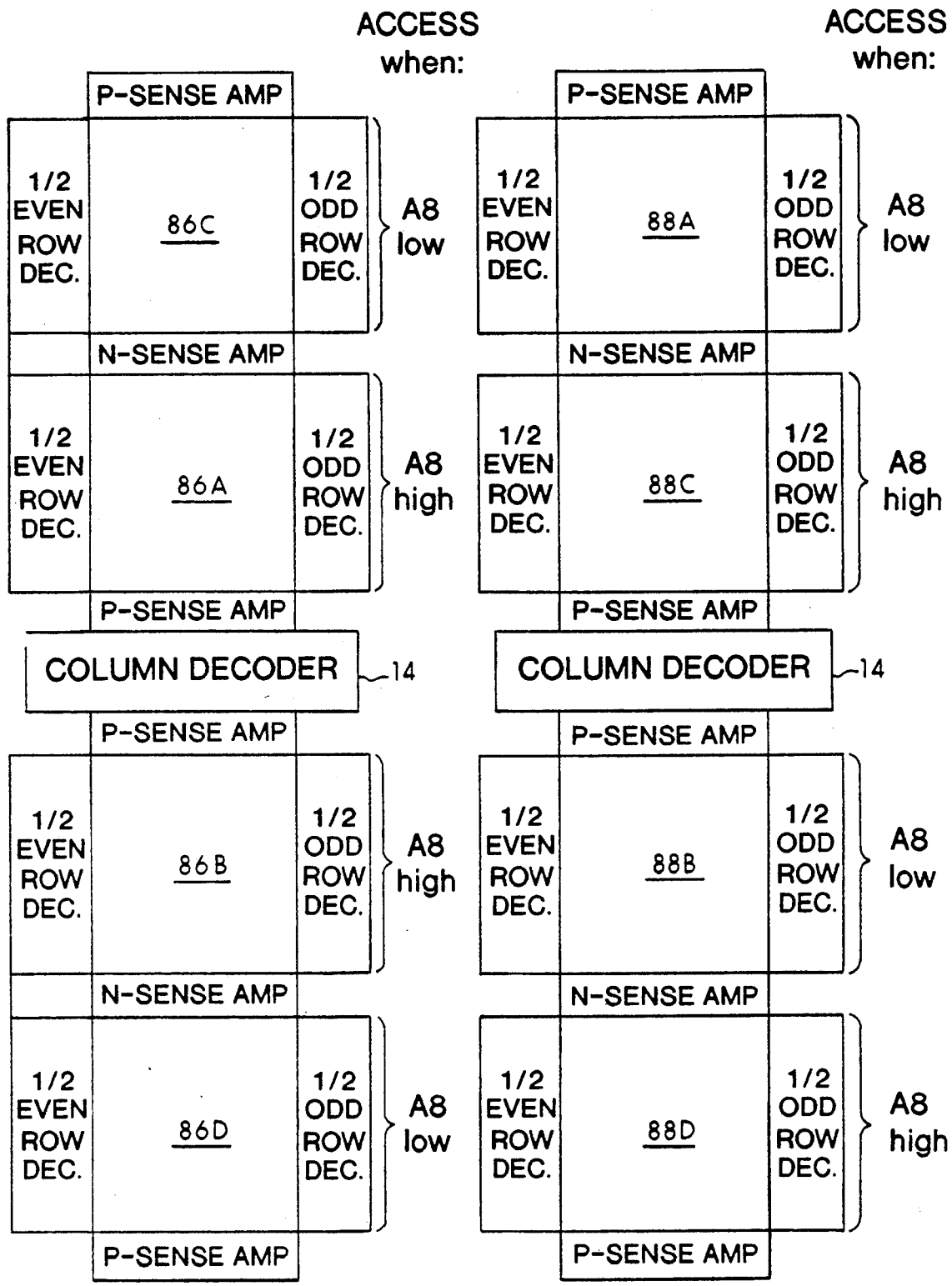
FIG. 8 is a block diagram of one quadrant of a memory array showing the prior art symmetric access topography.
FIG. 9 is a block diagram of one quadrant of a memory array showing the asymmetric access topography according to the invention.
Figure 11:
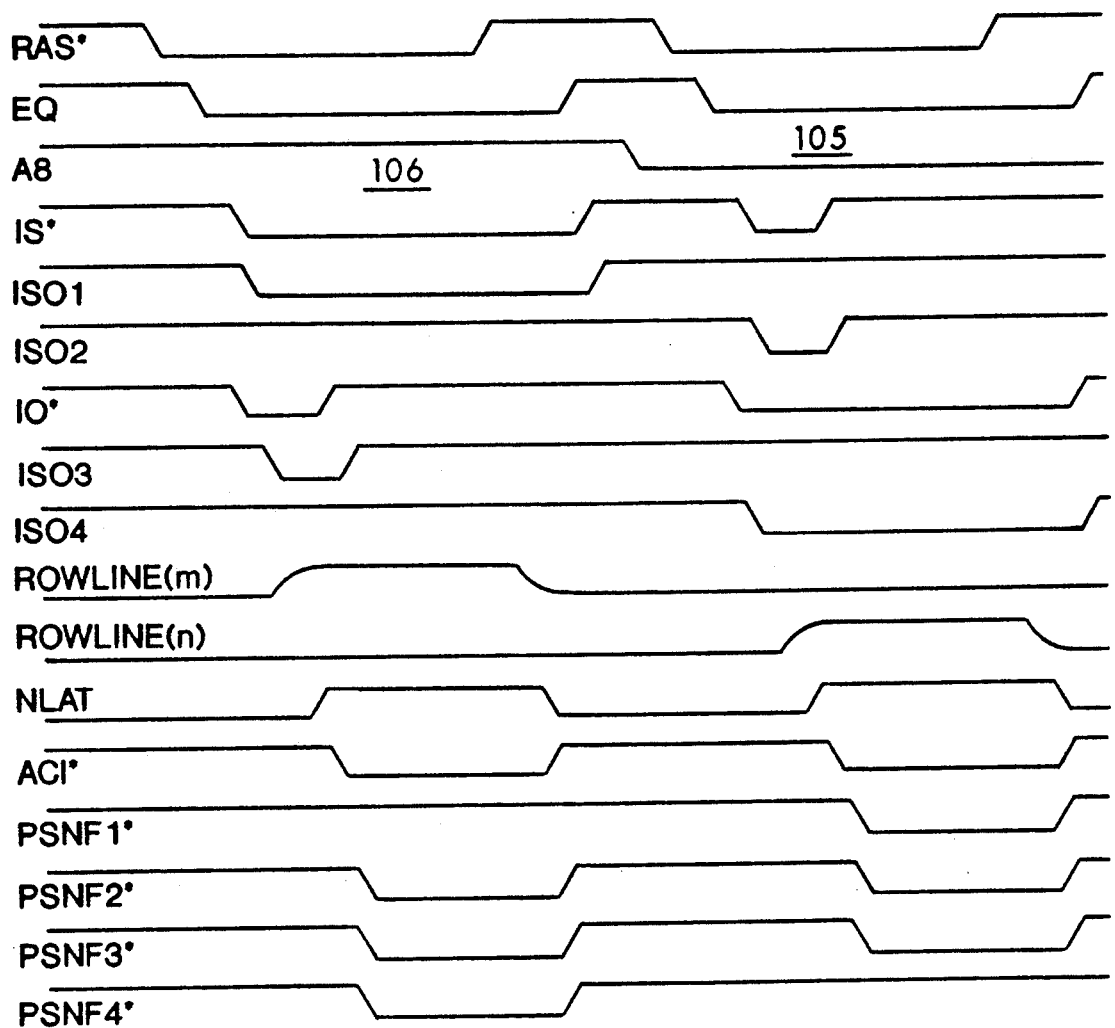
FIG. 11 is a timing diagram showing the cycles of timing signals utilized in a DRAM access for the integrated circuit of FIG. 10.

An important aspect of the invention is that a row access means 52, comprising the inputs 47 and row buffer 45, provide a row access signal A8 which defines a first row access cycle 105 and a second row access cycle 106 (FIG. 11). As illustrated in FIG. 9, when A8 is low, i.e., in the first row access cycle 105, a row is accessed in arrays 88A and 88B, and when the signal A8 is high, i.e., in the second row access cycle 106, a row is accessed in arrays 88C and 88D. As will be discussed in detail in Section 4 below, this is an asymmetric row address topology which provides more uniform use of power from access cycle to access cycle and leads to many other advantages.

2. The Memory Array Circuitry

Figure 3:
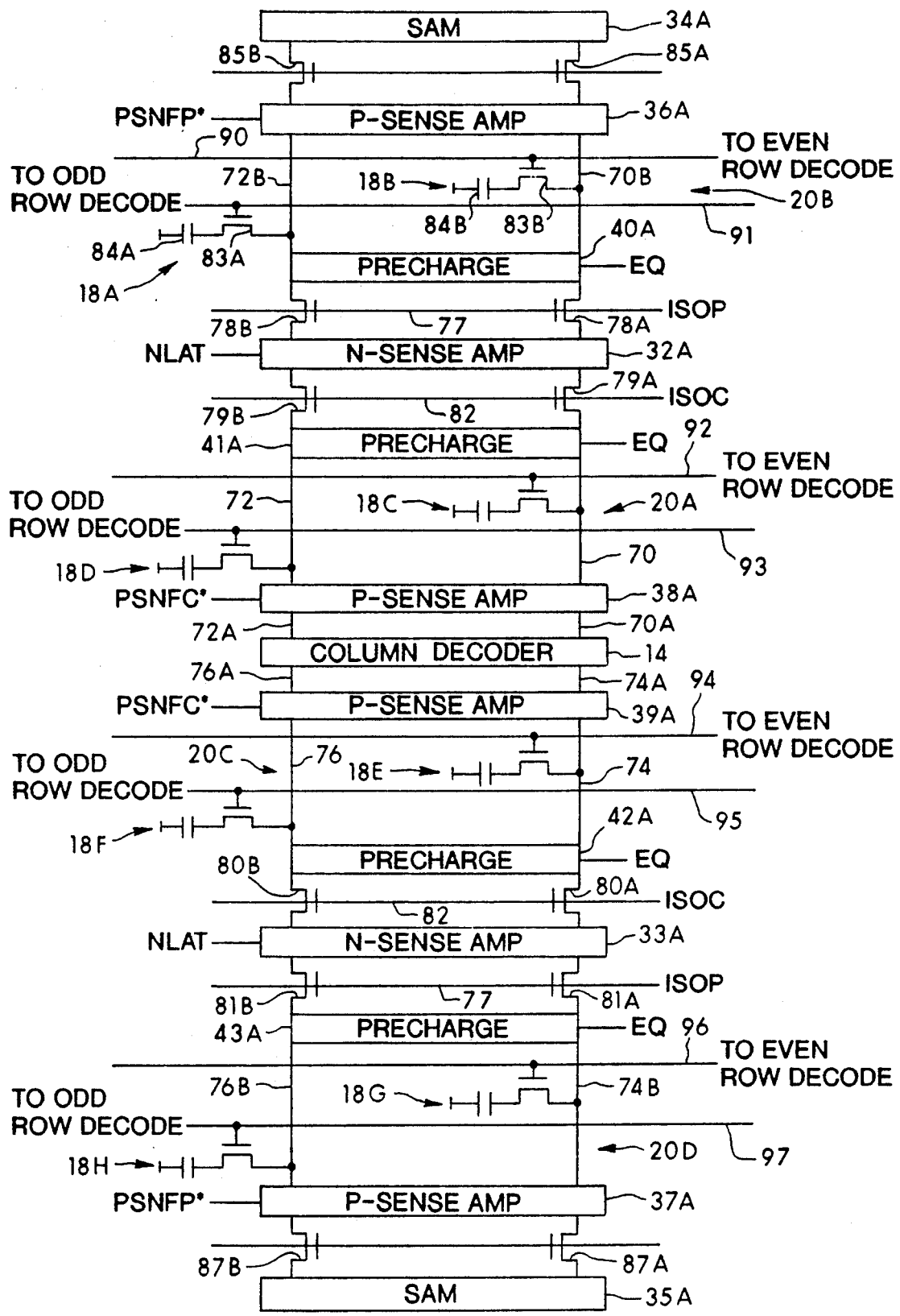
FIG. 3 is a circuit diagram illustrating the electronic architecture of one quadrant of an array according to a preferred embodiment of the invention.

FIG. 3 illustrates the circuitry in one memory quadrant, such as 22A. The circuit 71 includes column decoder 14, N-sense amplifiers 32A and 33A, P-sense amplifiers 36A, 38A, 37A, and 39A, precharge circuits 40A, 41A, 42A and 43A, SAMs 34A and 35A, a first column line pair 70 and 72 extending from column decoder 14 to SAM 34A and a second column line pair 74 and 76 extending column decoder 14 to SAM 35A. The circuit 71 also includes first isolating means 78A, 78B, second isolating means 79A, 79B, third isolating means 80A, 80B, fourth isolating means 81A, 81B, and SAM signal pass gates 85A, 85B, 87A, and 87B, all of which are n-channel transistors in the preferred embodiment. Finally the circuit 71 includes row lines 90 through 97 and memory cells 18A through 18H, each of which includes a transistor, such as 83A, and a capacitor, such as 84A. Each memory cell 18A through 18H represents 128 such cells and each row line 90 through 97 represents 128 such lines. The row line pump connections have not been shown in FIG. 3 so as to not unduly complicate the drawing, since their design and function is well-known in the art and the invention does not alter their operation. The invention can be used with or without row line pump circuitry.

The invention can be developed most generally by considering a single column line. From such a perspective, first N-sense amplifier 32A divides column line 70 into a first column line portion 70B and a second column line portion 70A, while second N-sense amplifier 33A divides second column line 74 into a third portion 74A and a fourth portion 74B. Further a first P-sense amplifier 36A is connected to the first column line portion 70B, a second P-sense amplifier 38A is connected to the second column line portion 70A, a third P-sense amplifier is connected to the third column line portion 74A, and a fourth P-sense amplifier is connected to the fourth column line portion 74B. And so on for first, second, third and fourth isolation means 78A, 79A, 80A, and 80B respectively. However, since the preferred embodiment is designed in the divided bit line pair architecture, it is clearer to discuss the invention in terms of bit line or column line halves. In these terms, N-sense amplifier 32A divides column line pairs 70 and 72 into two pairs of column line halves, 70A and 72A being a first pair of column line halves and 70B and 72B being a second pair of column line halves. Likewise N-sense amplifier 33A divides column line pair 74 and 76 into the pair of column line halves 74A and 76A and 74B and 76B.

The circuit 71 is connected as follows. Each of 128 Capacitors 84A have one side connected to a reference voltage and the other side connected to column line half 72B through its corresponding transistor 83A. The gate of each of the 128 transistors 83A is connected to one of 128 odd row lines 91. Likewise, referring to cells 18B, each of 128 capacitors 84B has one side connected to the reference voltage and the other side connected to column line half 70B through a corresponding transistor 83B, with the gate of each of 128 such transistors connected to one of 128 even row lines 90. In a like manner, 128 cells 18C are connected to column line half 70A and 128 even row lines 92, 128 cells 18D are connected to column line half 72A and one of 128 odd row lines 93, 128 cells 84E are connected to column line half 74A and 128 even row lines 94, 128 cells 18F are connected to column line half 76A and 128 odd row lines 95, 128 cells 18G are connected to column line half 74B and 128 even row lines 96, and 128 cells 18H are connected to column line half 76B and 128 odd row lines 97. Column line half 72B is connected to SAM 34A through transistor 85B and column line half 70B is connected to SAM 34A through transistor 85A. P-sense amplifier 36A is connected across column line halves 70B and 72B, and precharge circuit 40A connects the same two column line halves. Column line half 70A is connected to N-sense amp 32A through isolation transistor 78A and column line half 72B is connected to N-sense amplifier 32A through isolation transistor 78B. Column line half 70A is connected to N-sense amplifier 32 through isolation transistor 79A and column line half 72A is connected to N-sense amplifier 32 through isolation transistor 79B. Precharge circuit 41 connects column line halves 70A and 72A, and P-sense amplifier 38 is connected across the same two column line halves. On the lower side of column decoder 14, P-sense amplifier 39A is connected across column line halves 74A and 76A, and precharge circuit 42A connects the same two column line halves. N-sense amplifier 33A is connected to column line halves 74A, 76A, 74B, and 76B respectively through isolation transistors 80A, 80B, 81A, and 81B respectively. Precharge circuit 43A connects column line halves 74B and 76B, and P-sense amplifier 37A is connected across the same two column line halves. Column line half 74B is connected to SAM 35A through transistor 87A, while column line half 76B is connected to SAM 35A through transistor 87B. P-sense amplifiers 36A and 37A have inputs labeled PSNFP*, which is the timing signal which enables and disables their operation. Likewise P-sense amplifiers 38A and 39A have inputs labeled PSNFC*, the timing signal which enables and disables their operation. Likewise each of the precharge circuits 40A, 41A, 42A, and 43A and each of the N-sense amplifiers 32A and 33A have inputs labeled EQ and NLAT, respectively, the timing signals that enable and disable their operation. The gates of isolation transistors 78A, 78B, 81A, and 81B are connected to the line 77 which carries the timing signal ISOP. The gates of isolation transistors 79A, 79B, 80A, and 80B are connected to the line 82 which carries the timing signal ISOC. As shown in FIG. 1, the column decoder 14 has inputs from the column buffer 44 and outputs to the output decoder 60, and the SAM has outputs to the serial decoder 66. These inputs and outputs as well as other details of the column decoder 14 and SAMs 34A and 35A are known in the art and will not be discussed in detail. The design of N-sense amplifiers 32A, and 33A, P-sense amplifiers 36A, 37A, 38A, and 39A, and precharge circuits 40A, 41A, 42A, and 43A, and row line pump circuits 31 (FIG. 1) are also known in the art and thus will not be discussed in detail herein. There are 128 circuits such as 71 in each quadrant, such as 22A. Each of the even row lines 90, 92, 94, and 96 (each representing 128 such row lines) connect to one of the 128 transistors in the cells that are connected to the right hand column line of the column line pair in each such circuit, and each of the odd row lines 91, 93, 95, and 97 (each representing 128 such row lines) connect to one of the 128 transistors in the cells that are connected to the left hand column line of the column line pair in each such circuit. With 128 such circuits 71, and with 128 cells connected to even row lines and each right hand column line half, plus 128 cells connected to odd row lines and each left hand column line half, we arrive at the 256×128 cells in o each array such as 20B.

As indicated above, the circuit 71 differs from the prior art memory array circuits in that it has an additional P-sense amplifier 38A associated with the upper column line pair 70 and 72 and an additional P-sense amplifier 39A associated with the lower column line pair 74 and 76. From the description of the connection of the circuits above, several advantages of having an the additional P-sense amplifier associated with each column line pair is evident. First of all, each pair of column line halves has a P-sense amplifier acting directly on them. Thus the voltage on them will separate to logic 1 and logic 0 faster. Secondly, when column line half 70A goes high, it no longer has to be pulled up to the high logic state through a pair of transistors 78A and 79A. Rather it is pulled up to the high logic state via P-sense amplifier 38A. Thus, with the use of a word line pump circuit 31, the memory cells, such as 18C, can be pulled up to the full logic 1 voltage. Likewise for column line halves 70A, 72A, 74A, and 76A located closest to the column decoder and their respective memory cells. Thirdly, since the circuit no longer has to pull the column line halves located closest the column decoder up through the isolating transistors 78A through 81B, these transistors no longer must be low or natural threshold transistors, but can be high threshold transistors like all the other transistors 83A, etc. in the memory circuit 12. Thus the fabrication mask step that was used to make the low threshold isolation transistors in the prior art can be eliminated.

3. The Circuit Timing and Function

Figure 4:
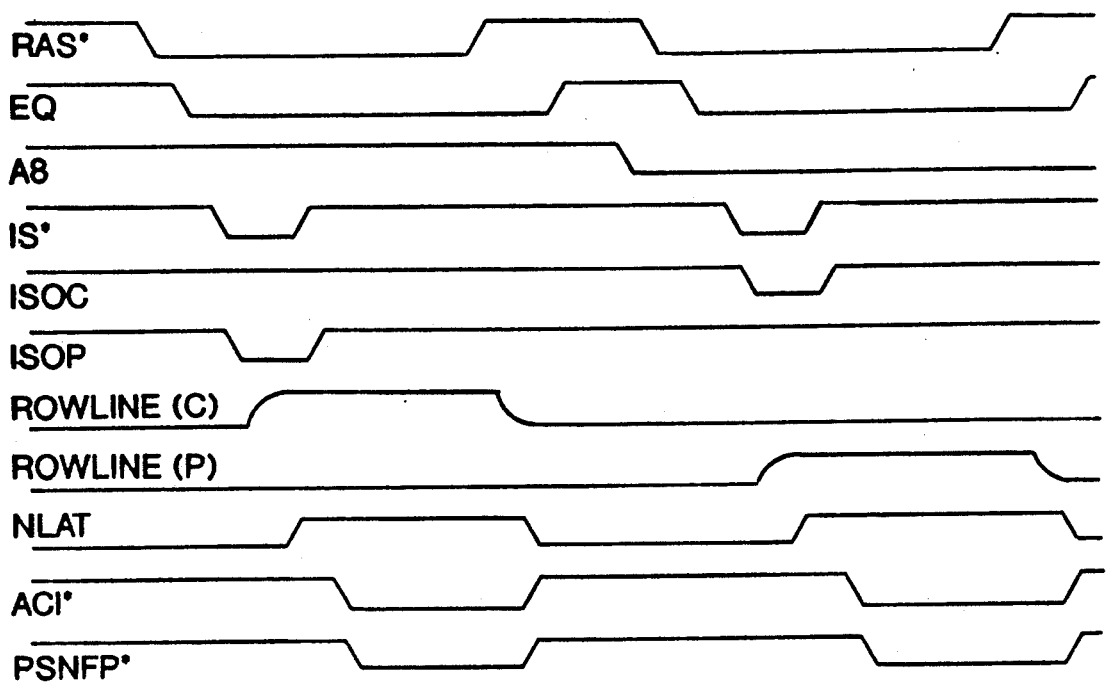
FIG. 4 is a timing diagram for a prior art DRAM showing the cycles of timing signals utilized in the array access functions.
Figure 5:
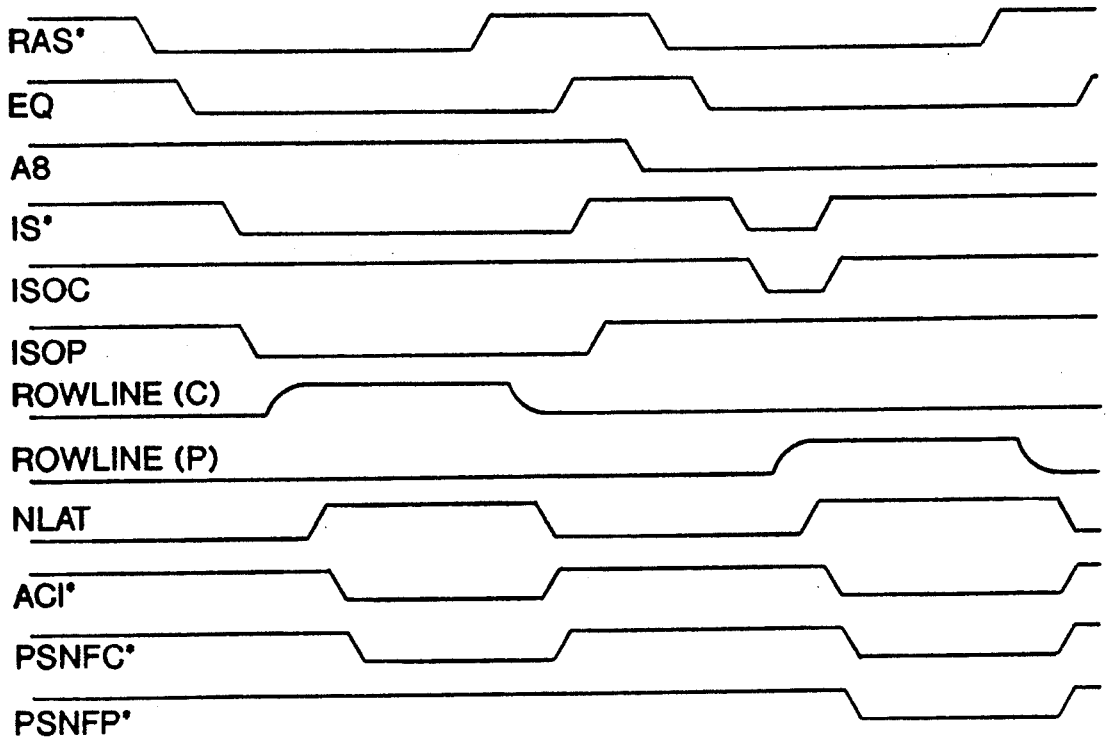
FIG. 5 is a timing diagram showing the cycles of timing signals utilized in a DRAM access for the integrated circuit of FIG. 3.

FIG. 4 is a timing diagram of the timing signals relevant to the invention for a DRAM access cycle in a prior art integrated circuit memory using only one P-sense amplifier per column line pair. FIG. 5 shows the analogous timing signals for a DRAM access cycle according to the invention. We shall first describe with reference to FIG. 5 how the circuit 71 of FIG. 3 operates for typical accesses, then compare the timing cycles of FIGS. 4 and 5 to see how the timing of the circuit according to the invention differs from the prior art. It should be understood that the timing diagrams are meant to illustrate the invention only and should not be taken as precise measurements of actual signals. Referring to FIG. 5, except as indicated below, all the signals shown are derived from RAS*; that is they are generated in timing signal generator 50 by a timing chain type circuit to produce the signals as shown. The signals shown are: RAS*, the row address signal that either directly or indirectly defines all the time periods associated with row access; EQ, which enables and disables the precharge circuits; the A8 row address signal; IS*, an intermediate timing signal used in the isolation transistor timing; ISOC, a signal derived from A8 and IS* and which enables and disables the isolation transistors nearest the column decoder; ISOP, a signal derived from A8 and IS* and which enables and disables the isolation transistors farthest from the column decoder (and nearest the single P-sense amplifier in the prior art); Rowline (c), the signal which is applied to the cell transistor gates of the row addressed when A8 is high, i.e. in FIG. 3, a row in the arrays 20A and 20C closest to the column decoder; Rowline (p), the signal which is applied to the cell transistor gates of the row addressed when A8 is low, i.e. in FIG. 3, a row in the arrays 20B and 20D closest to the SAMs; NLAT, the signal that enables and disables the N-sense amplifiers and the defines the N-sense operating periods; ACI*, an intermediate signal used in the P-sense amplifier timing; PSNFC*, which enables and disables the P-sense amplifiers nearest the column decoder and thus defines their operating periods; and PSNFP*, which enables and disables the P-sense amplifiers farthest from the column decoder and thus defines their operating periods. Referring to FIGS. 3 and 5, the circuit 71 functions as follows. When an access of the memory circuit 12 is made, the RAS* signal drops which causes the row line buffer 45 to place a row address on its outputs. The architecture in the preferred embodiment of FIG. 3 is designed so that when the A8 signal is high, one row in each of the arrays 20A and 20C is addressed and when the A8 signal is low, one row in each of arrays 20B and 20D is addressed. For purposes of this discussion, we Will first assume that A8 is high and the rows associated with row lines 92 and 94 are addressed. Shortly after the RAS* signal drops, the CAS* signal (not shown in FIGS. 4 and 5) drops and the column buffer 44 places a column address on its outputs. For purposes of this discussion, assume that the address of the column of circuit 71 is selected. Shortly after RAS* drops, EQ goes low which disables the precharge circuits 40A, 41A, 42A, and 43A. ISOP then goes low turning off isolation transistors 78A and 78B to isolate column line halves 70B and 72B and the P-sense amplifier 36A from the column line halves 70A and 72A, N-sense amplifier 32A, and P-sense amplifier 38A, and also turning off transistors 81A and 81B to isolate column line halves 74B and 76B and P-sense amplifier 37A from column line halves 74A and 76A, N-sense amplifier 33A, and P-sense amplifier 39A. For purposes of this discussion we will assume that the access is a DRAM read cycle and the signal stored in cell 18C is a logic 1 while the signal stored in cell 18E is a logic 0. While the transistors 78A, 78B, 81A, and 81B are turning off, row lines 92 and 94, responding to the address on lines 48 (FIG. 1), begin to go high turning on the transistors in cells 18C and 18E. This allows the signal stored on the capacitor of cell 18C to be placed on column line half 70A and the signal stored on the capacitor of cell 18E to be placed on column line half 74A. Thus the signal on column line half 70A will begin to rise and the signal on column line half 74A will begin to fall. As soon as these signals begin to develop, NLAT goes high turning on N-sense amplifiers 32A and 33A. The N-sense amplifiers drive the low side of the pair of column line halves to a logic 0. thus column line halves 72A and 74A will begin to go to logic 0. Then PSNFC* goes low turning on P-sense amplifiers 38A and 39A. The P-sense amplifiers drive the high one of the column line halves they are connected across to logic 1, or as close thereto as possible. Thus column line halves 70A and 76A are driven toward logic 1. Meanwhile, responding to the address on lines 46 (FIG. 1), column decoder 14 connects the column line pairs at the address output from column address buffer 44 to the data input/output lines 62 (FIG. 1); namely, column lines 70 and 72 are connected to one pair of input/output lines 62 (FIG. 1) and the column lines 74 and 76 are connected to another pair of the input/output lines 62, which sends the logic 1 stored in cell 18C and the logic 0 stored in cell 18E to the data output 56. Then RAS* returns high, causing row lines 92 and 94 then go low, shutting off the transistors in cells 18C and 18E so that subsequent voltages on the column line halves 70A and 74A will not affect the status of the charge on the capacitors in the respective cells, NLAT goes low and PSNFC. goes high shutting off N-sense amplifiers 32A and 33A and P-sense amplifiers 38A and 39A, respectively, then EQ goes high enabling precharge circuits 40A, 41A, 42A, and 43A which connect column line 70 to column line 72 and column line 74 to column line 76 respectively, which causes them to charge to an intermediate level between logic 1 and logic 0. Finally ISOP goes high, turning on transistors 78A, 78B, 81A, and 81B to once again connect the halves of the column lines 70, 72, 74 and 76.

Assume that the next access is also a DRAM read and A8 is low, and thus row decoder 16 addresses one row in each of arrays 20B and 20D. Also assume that the rows accessed are those associated with row line 91 in array 20B and row line 97 in array 20D, and that the column addressed is again that of circuit 71 shown in FIG. 3. Again RAS* and CAS* go low and initiate the output of the addresses on buffers 44 and 45, and, shortly after RAS. goes low, EQ goes low disabling precharge circuits 40A, 41A, 42A, and 43A. Then ISOC goes low, turning off transistors 79A, 79B, 80A, and 80B thus isolating column line halves 70A and 72A from column line halves 70B and 72B, respectively, and also from N-sense amplifier 32A and P-sense amplifier 36A, and also isolating column line halves 74A and 76A from column line halves 74B and 76B, respectively, and also from N-sense amplifier 33A and P-sense amplifier 37A. Next the row lines 91 and 97 begin to go high turning on the transistors in cells 18A and 18H, respectively, placing the signals in the cells on column line halves 72B and 76B, respectively. NLAT then goes high, turning on the N-sense amplifiers 32A and 33A which drives the lower of the column line halves to which they are connected to logic 0. Then, ISOC goes high again, turning on transistors 79A, 79B, 80A, and 80B thus reconnecting column line halves 70A and 72A to column line halves 70B and 72B, respectively, and also to N-sense amplifier 32A and P-sense amplifier 36A, and also reconnecting column line halves 74A and 76A to column line halves 74B and 76B, respectively, and also to N-sense amplifier 33A and P-sense amplifier 37A. Then PSNFC* and PSNFP* go low, turning on P-sense amplifiers 38A and 39A, and 36A and 37A, respectively, which pulls up the high one of the column line halves to which they are connected to logic 1, or as near thereto as possible. Meanwhile, responding to the address on lines 46 (FIG. 1), column decoder 14 connects the column line pairs at the address output from column address buffer 44 to the data input/output lines 62 (FIG. 1); namely column lines 70 and 72 are connected to one pair of input/output lines 62 (FIG. 1) and the column lines 74 and 76 are connected to another pair of the input/output lines 62, which sends the logic signals stored in cells 18C and 18E to the data output 56. Then RAS. returns high causing row lines 91 and 97 to go low turning off the transistors of cells 18A and 18H respectively, preventing the capacitors of the respective cells from being affected by subsequent voltages on column line halves 72B and 76B respectively. NLAT then returns low and PSNFC* and PSNFP* return high, shutting off N-sense amplifiers 32A and 33A and P-sense amplifiers 38A and 39A and 36A and 37A, respectively. Finally, EQ returns high enabling precharge circuits 40A, 41A, 42A, and 43A which connect column line 70 to column line 72 and column line 74 to column line 76 respectively, which causes them to charge to an intermediate level between logic 1 and logic 0.

Comparing FIGS. 4 and 5, it is seen that the timing signals of the invention differ from the timing signals of the prior art in that there is an additional P-sense amplifier signal and that, in the A8 high access, ISOP stays low right through the firing of the P-sense amplifier. Moreover, only one of the P-sense amplifiers associated with each column line pair fires during this cycle. Thus, in the invention, referring to the top half of FIG. 3, the N-sense amplifier 32A and P-sense amplifier 38A remain isolated from the column line halves 70B and 72B throughout the amplification cycle and only the column line halves 70A and 72A are charged. Likewise, referring to the bottom half of FIG. 3, on the same cycle, only the column line halves 74A and 76A are charged. In the other part of the cycle shown in FIG. 5, when A8 is low, all four of the P-sense amplifiers 36A, 37A, 38A, and 39A fire and the entire column lines 70, 72,74, and 76 are charged. Thus, as compared to the prior art, in DRAM access, the integrated circuit of the invention will save 50% of the power 50% of the time. In write mode the timing will be similar, except all the P sense amplifiers will be disabled for a short period of time to allow overwrite of the column pairs, and the column line connection to the input/output lines 54 and 56 will vary as is known in the art, allowing the input signal to flip the column lines and the cells being addressed to the input logic level. Again in the A8 high accesses the column line halves 70B, 72B, 74B, and 76B on the SAM side will be isolated from the column line halves 70A, 72A, 74A, and 76A respectively on the column decoder side until into the precharge portion of the cycle, thus saving 50% of the power 50% of the time.

Figure 6:
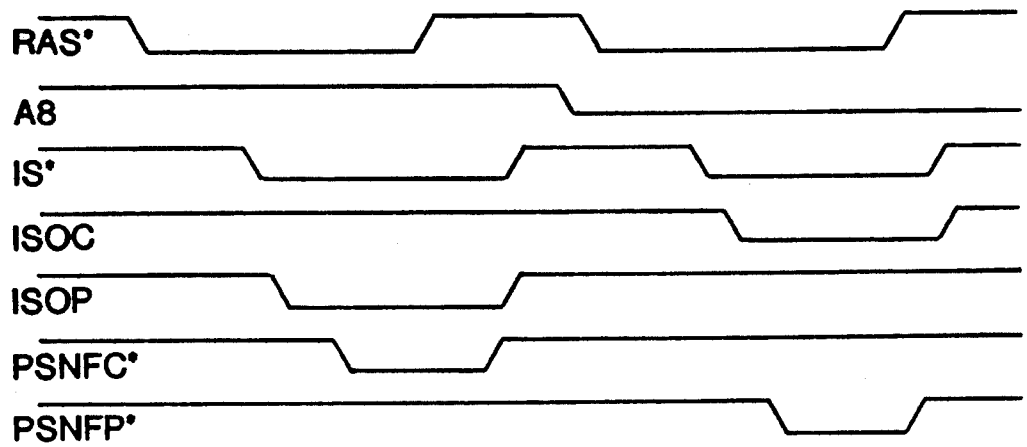
FIG. 6 is a timing diagram showing the cycles of timing signals utilized in the refresh function for the integrated circuit of FIG. 3.

FIG. 6 is a timing diagram of the circuit 71 of FIG. 3 during a typical refresh cycle. The refresh period, as is known in the art is, a cycle initiated by the RAS. signal dropping after the CAS* signal drops, commonly called CAS before RAS refresh (CBR). This period may be controlled from outside the chip 10 or on board the chip 10. In either case the timing generator means 50 provides the appropriate RAS* and CAS* signals. As seen from the figures, in both the A8 high mode and A8 low mode the return of both the ISOC and ISOP to high is delayed until after the P-sense amplifier cycle. Thus the column line halves not associated with the row being refreshed are isolated from the column line halves associated with the row being refreshed through the entire refresh amplification cycle. Also, only the P-sense amplifiers associated with the row being refreshed are fired. Thus 50% of the power is saved in 100% of the refresh cycles.

Figure 7:
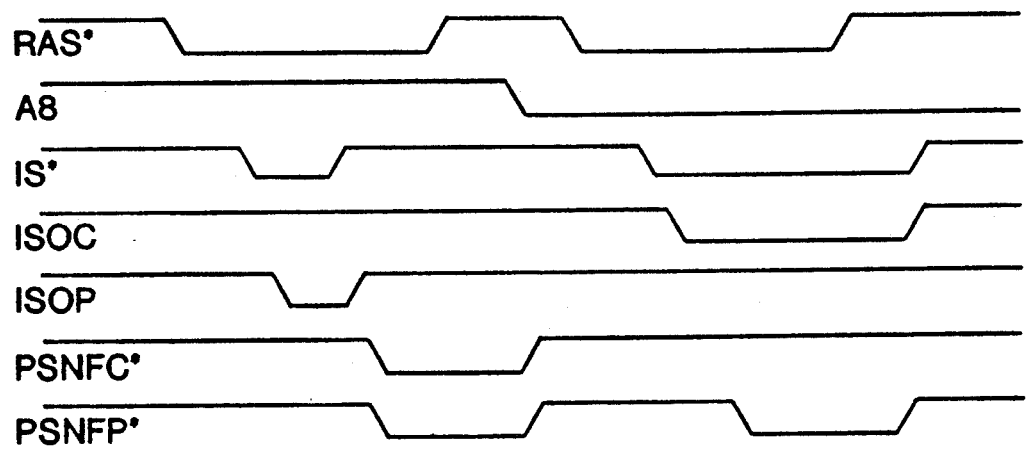
FIG. 7 is a timing diagram showing the cycles of timing signals utilized in a VRAM access for the integrated circuit of FIG. 3.

FIG. 7 is a timing diagram for a VRAM access cycle. Examples of VRAM cycles are Read Transfer, Split Read Transfer, Write Transfer, Marked Write Transfer, and Flash Write. In this mode the timing of ISOC and ISOP are interchanged as is the timing of PSNFC* and PSNFP*. During the access of arrays 20B and 20D (A8 low), isolator transistors 79A, 79B, 80A, and 80B are held off until through the P-sense cycle and into the precharge cycle, and P-sense amplifiers 38A and 39A are not fired. Thus the column line halves 70A, 72A, 74A, and 76A are not charged in these accesses, because these VRAM modes deal exclusively with the SAM side column halves, and this mode also saves 50% of the energy 50% of the time.

4. The Preferred Circuit Access Topology

Turning now to FIG. 8 the prior art access topology is shown. In the prior art, when the row address line A8 was high, a row in the two arrays 86A and 86B nearest the column decoder 14 was accessed. When A8 was low, a row in the two arrays 86C and 86D farther from the column decoder 14 was accessed. The preferred topology of the invention is shown in FIG. 9. In this topology, when A8 is high, one array 88C near the column decoder 14 and one array 88D farther from the column decoder 14 are accessed. Likewise, when A8 is low, one array 88B near the column decoder 14 and one array 88A farther from the column decoder 14 are accessed. For ease of reference, we shall refer to the access topology of the prior art shown in FIG. 8 as symmetrical access topology and the access topology of the preferred embodiment of the invention, an example of which is shown in FIG. 9, as asymmetrical access topology. The invention also contemplates other embodiments of asymmetrical access topology, such as to access arrays 88B and 88A when A8 is high and to access arrays 88C and 8D when A8 is low.

The embodiments of FIGS. 3 through 7 utilize symmetrical access topology to demonstrate that the dual P-sense amplifier aspect of the invention discussed in Section 2 above and the timing aspect of the invention discussed in Section 3 above both have distinct advantages even when the prior art access topology is used. However, as will be shown below, these aspects of the invention have additional advantages when the asymmetrical access topology of the invention is used.

Figure 10:
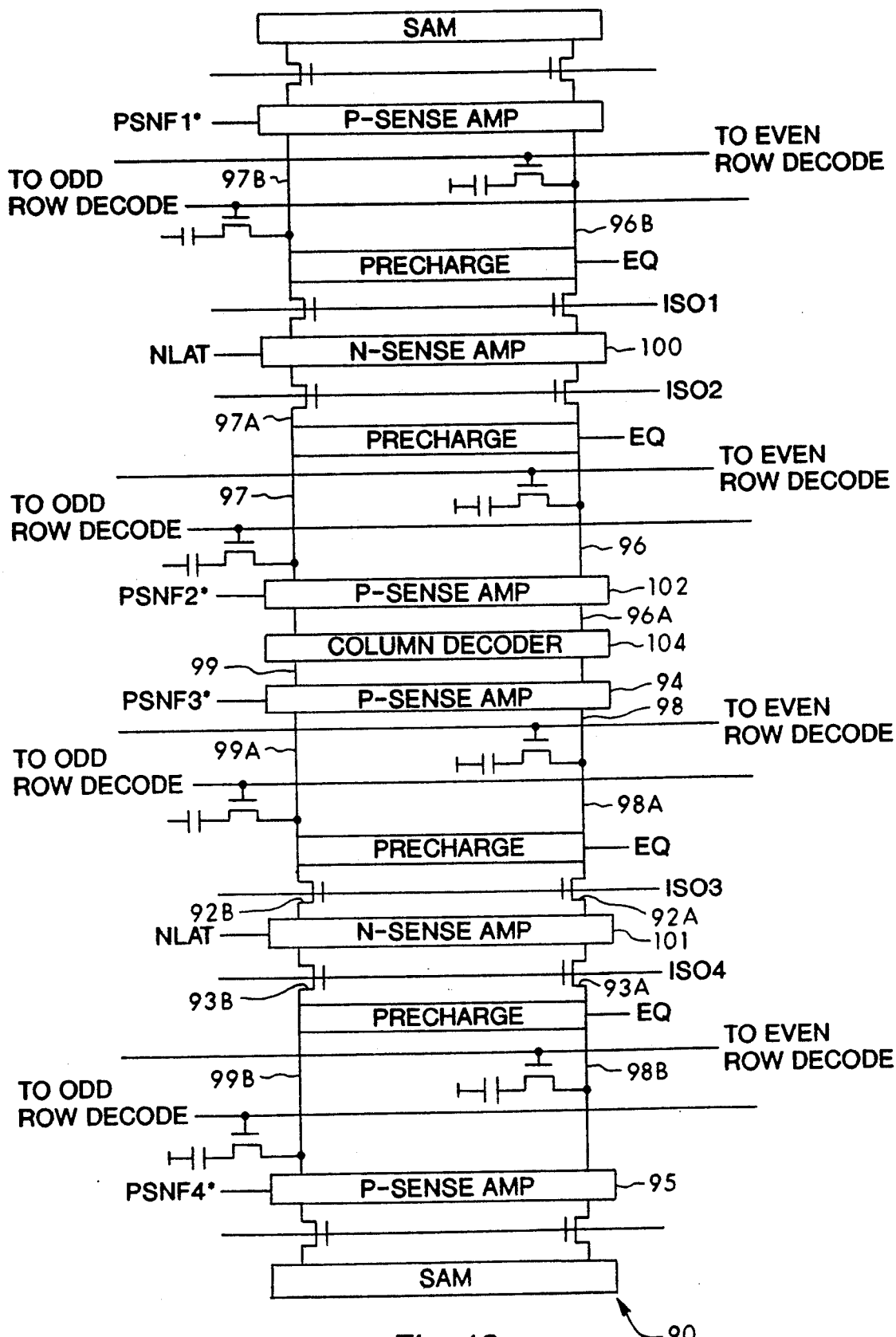
FIG. 10 is a circuit diagram illustrating the electronic architecture of one quadrant of an array according to another preferred embodiment of the invention employing the asymmetric access topology.

FIG. 10 shows a circuit 90 illustrating the asymmetrical topology of the invention, while FIG. 11 is a timing diagram showing the relevant timing signals of the this topology. Circuit 90 is identical to the circuit 71 of FIG. 3, except that, as will be discussed below, some of the timing signals are different. This circuit can also be discussed in a generalized sense focusing on a single column line on each side of the column decoder 104, and dividing one column line, such as 96, into a first column line portion 96B, a second column line portion 96A, while dividing the second column line into a third column line portion 98A and a fourth column line portion 98B, and so on with the N-sense amplifiers, P-sense amplifiers, and isolating means. The N-sense amplifiers, P-sense amplifiers, and isolating means are labeled from top bottom, for example, the top pair of isolating transistors which are connected to the ISO1 signal is the "first isolating means", the next pair of isolating transistors connected to the ISO2 signal is the "second isolating means", etc. With the differences in timing signals, the signal labeling that corresponded to prior art labeling and was referenced to the column decoder end (e.g. ISOC) and the old prior art P-sense end (e.g. ISOP) is no longer relevant, and in fact is misleading, so a new labeling scheme for the various signals has been introduced in FIG. 10, which labeling scheme is more consistent with the generalized perspective. The timing signals for the topology of FIG. 9 as applied to the circuit of FIG. 10 are shown in FIG. 11. The A8 signal defines a first row access time period 105 in which the first pair of column line halves, 96B and 97B and the third pair of column line halves 98A and 99A are addressed, and a second time period 106 in which the second pair of column line halves 96A and 97A and the fourth pair of column line halves 98B and 99B are addressed. It should be noted that because the timing curves of FIG. 11 were made analogous to the timing curves of FIG. 5 for ease of comparison, the first access time period 105 is the one on the right of FIG. 11 and the second row access time period 106 is the one on the left. Comparing FIG. 11 with FIG. 5, we see that the RAS*, EQ, A8, IS*, NLAT, and ACI* signals are the same, that ISO1 and ISO2 are the same as ISOP and ISOC, respectively, that Rowline (m) and Rowline (n) are the same as Rowline (c) and Rowline (p), respectively, and PSNF1* and PSNF2* are the same as PSNFP* and PSNFC*, respectively. In sum, the signals for the top two arrays B8A and 88C in FIG. 9 are the same as for the top two arrays 86C and 86A in FIG. 8. However, for the asymmetrical topology, a new intermediate isolation signal, IO*, is provided, and new signals ISO3 and ISO4 which are input into isolation transistors 92A and 92B, and 93A and 93B, respectively, are derived from this new intermediate signal. Also, new signals PSNF3* and PSNF4* which are input into P-sense amplifiers 94 and 95, respectively, are provided. With these new signals, in FIG. 10, the operation of the isolation transistors 92A, 92B, 93A, and 93B and the P-sense amplifiers 94 and 95 when A8 is high is the same as for the topology of FIG. 8 when A8 is low, and their operation when A8 is low is the same as for the topology of FIG. 8 when A8 is high. Thus when A8 is high, the column line halves 96B and 97B in the portion of the circuit 90 above column decoder 14 are isolated from the N-sense amplifier 100 and the active P-sense amplifier 102 and are not charged, while in the portion of the circuit below the column decoder 14, the full column lines 98 and 99 are charged. When A8 is low, in the portion of the circuit 90 above column decoder 14 the full column lines 96 and 97 are charged, while in the portion of the circuit 90 below the column decoder 14 the column line halves 98B and 99B are isolated from the N-sense amplifier 101 and the active P-sense amplifier 94 and are not charged. Thus in the asymmetrical topology, the memory array of the invention saves 25% of the power 100% of the time in DRAM accesses. This is preferable to saving 50% of the power 50% of the time because it smooths out the power curve of the memory, resulting in faster response, the elimination of potential problems related to power surges, and a lower peak power consumption.

Figure 12:
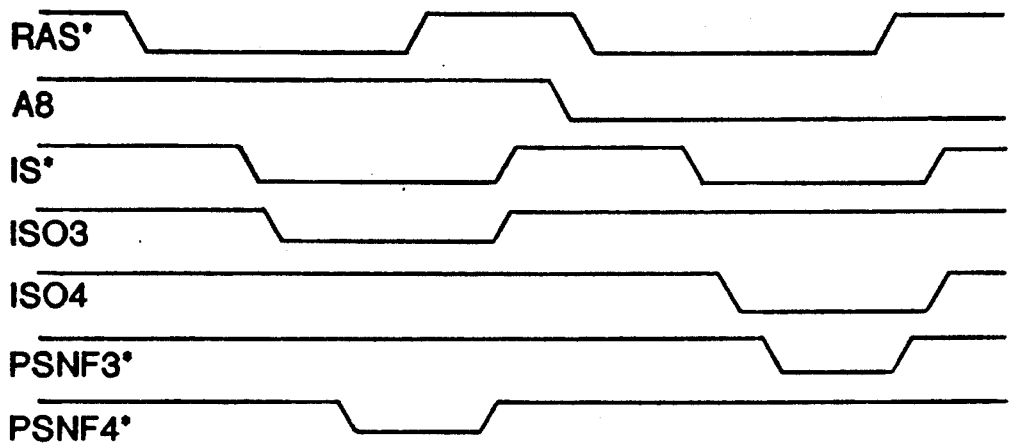
FIG. 12 is a timing diagram showing the cycles of timing signals utilized in the refresh function for the integrated circuit of FIG. 10.

FIG. 12 shows the refresh cycles with the asymmetrical topology. The signals ISO1, ISO2, PSNFI*, and PSNF2* are the same as ISOP, ISOC, PSNFP*, and PSNFC* respectively in FIG. 6 and thus are not given. In the refresh cycle, the new P-sense amplifier signals can be derived from IS*, although one could also use an IO* signal that was identical to IS. in this mode. Again the savings in power is 50% of the power 100% of the time, which also provides the advantages mentioned in the above paragraph. FIG. 7 shows the VRAM access cycles for the asymmetrical topology. Here the power savings for the portions of the circuit above and below the column decoder 14 are reversed from the DRAM cycle, but the result is the same, a 25% power savings 100% of the time. Thus the asymmetrical topology provides the advantages of a smoother power curve, faster response, the elimination of potential problems related to power surges, and a lower peak power consumption in all modes, thus permitting savings in design and fabrication and/or better reliability and less defects.

Figure 13:
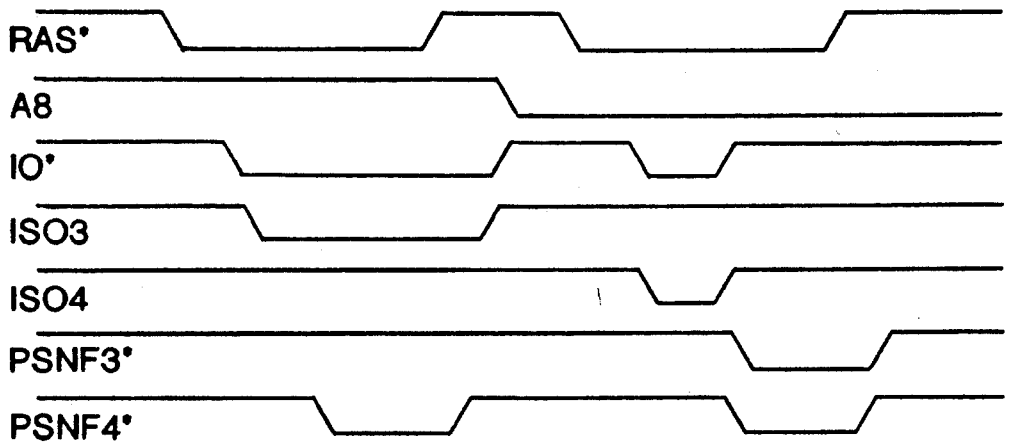
FIG. 13 is a timing diagram showing the cycles of timing signals utilized in a VRAM access for the integrated circuit of FIG. 10.
Figure 14:
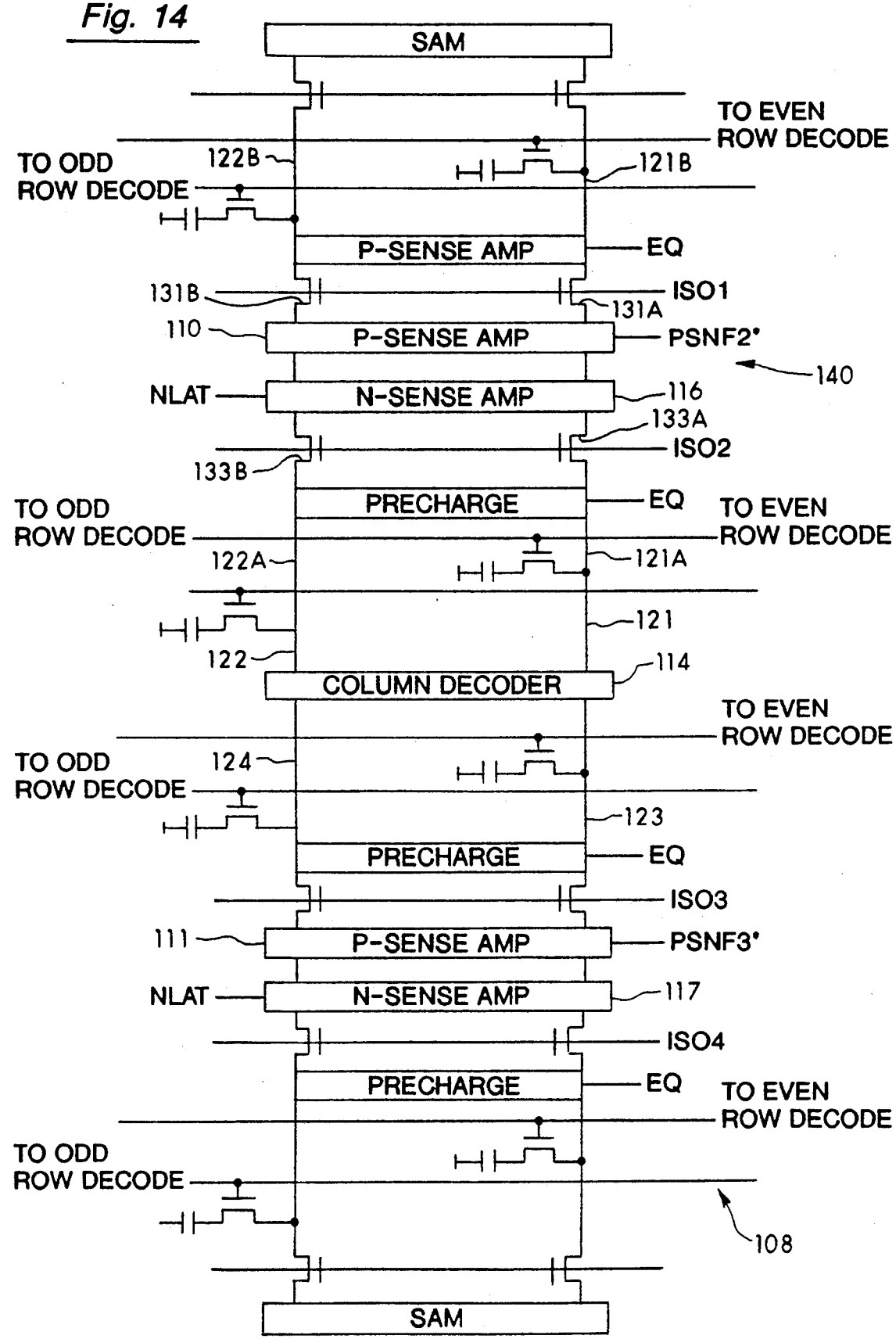
FIG. 14 is a circuit diagram illustrating the electronic architecture of one quadrant of an array according to another preferred embodiment of the invention.

FIG. 14 illustrates an alternative embodiment of the invention that also provides the advantages of power savings of 50% of the power 50% of the time with the symmetrical topology and 25% of the power 100% of the time with the asymmetrical topology. This circuit 108 is the same as the circuit 90 in FIG. 10 except that there is only one P-sense amplifier associated with each column line pair: P-sense amplifier 110 connected across column lines 121 and 122, and P-sense amplifier 111 connected across column lines 123 and 124. P-sense amplifier 110 is located adjacent N-sense amplifier 116 and P-sense amplifier 111 is located adjacent N-sense amplifier 117. In the embodiment of FIG. 14, the asymmetrical topology is used, thus the timing signals are as shown in FIGS. 11, 12, and 13, except there is no need for the PSNF1* and PSNF4* signals. This embodiment requires only half the P-sense amplifiers of the embodiments of FIGS. 3 and 10 and has all the other advantages of those embodiments, except that the P-sense amplifier 110 must pull up each of column line halves 121A, 122A, 121B, and 122B through an isolation transistor 133A, 133B, 131A, and 131B, respectively, and likewise for the portion of circuit 108 below column decoder 114. Thus the isolation transistors 133A, 133B, 131A, and 131B should preferably be low threshold transistors requiring the extra mask process in fabrication. Further, as compared to the prior art, this embodiment has the advantage of pulling up both column line pair halves to the same voltage, thus resulting in smoother voltage and power curves, which provides savings in design and fabrication and/or better reliability and less defects.

Figure 15:
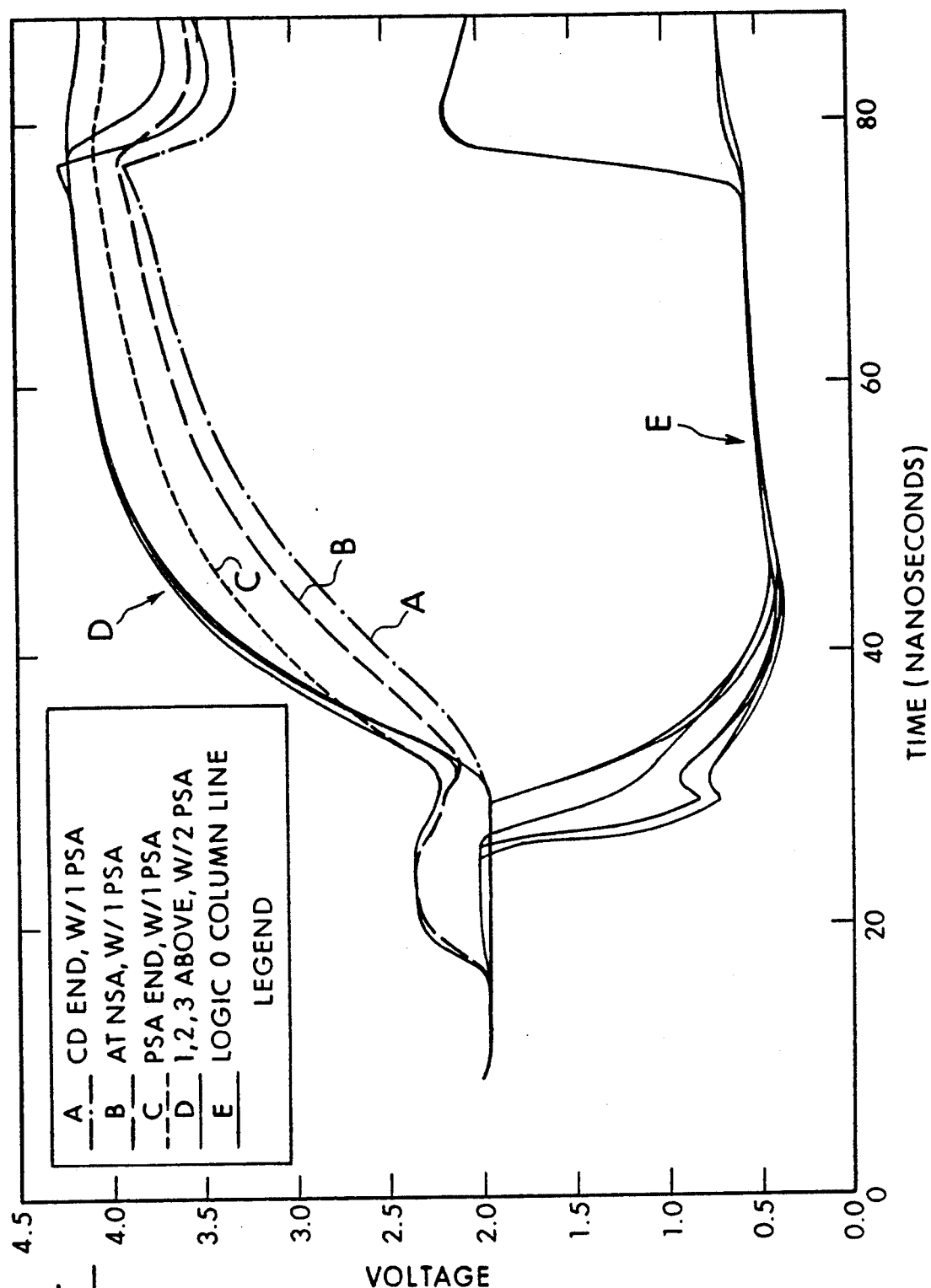
FIG. 15 is a graph of the voltage on the column lines versus time comparing the voltage response for the an amplifier architecture with one P-sense amplifier as in the prior art with the voltage response with two P-sense amplifier architecture of FIG. 3.
Figure 16:
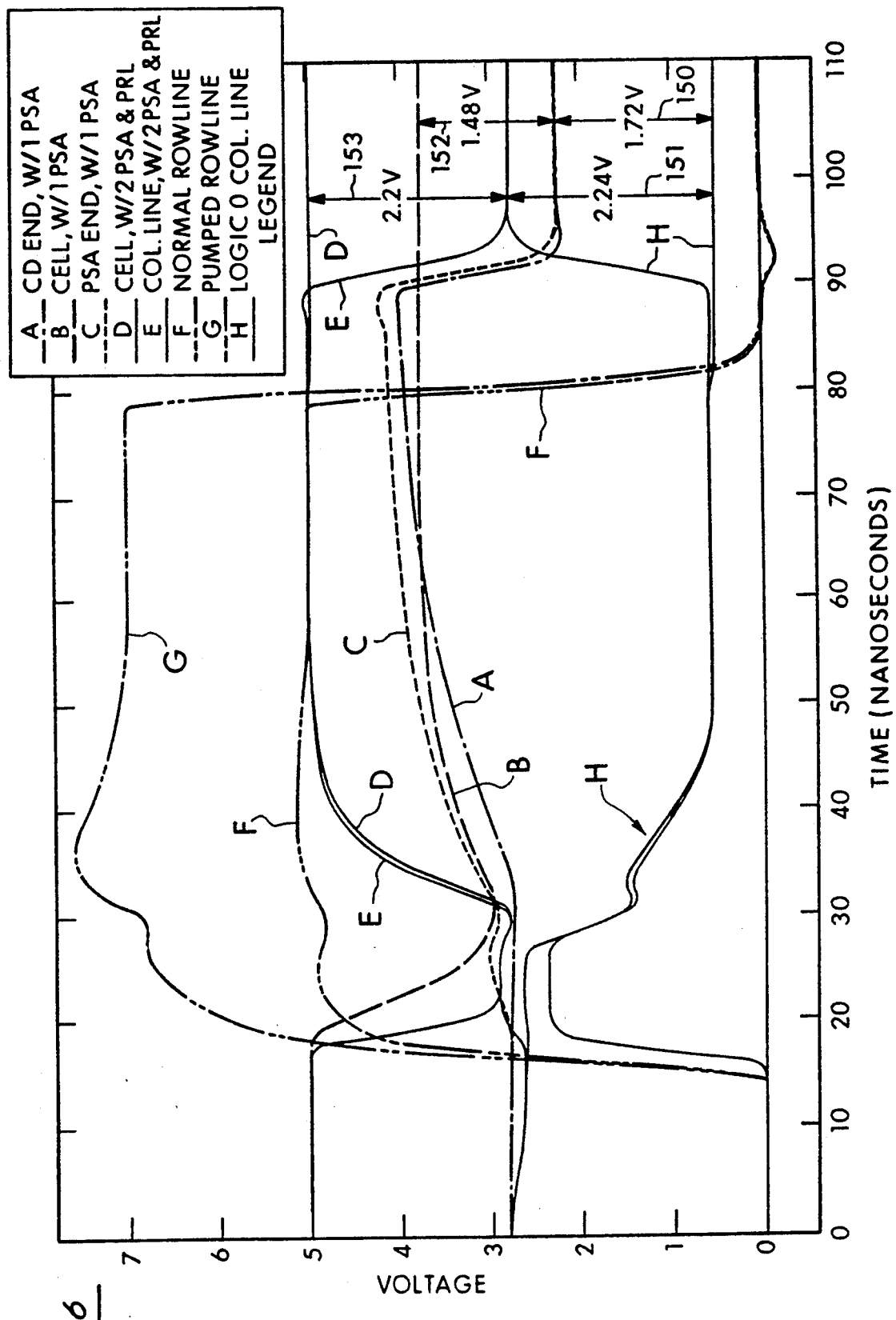
FIG. 16 is a graph of voltage versus time comparing the 1's and 0's margins for a prior art amplifier architecture with one P-sense amplifier and an unpumped row line with the 1's and 0's margin for the two P-sense amplifier architecture of FIG. 3 with a booted row line.

FIGS. 15 and 16 illustrate additional advantages of the invention. FIG. 15 is a graph of the voltage at various points on the column lines, such as 70 and 72, during a DRAM read cycle. Curves A through C and the three curves D are all voltages on the high or logic 1 column line. Curve A is the voltage at the column decoder end with the prior art one P-sense amplifier architecture, curve B is the voltage at the N-sense amplifier with the prior art one P-sense amplifier architecture, while curve C is the voltage at the P-sense amplifier end with the prior art one P-sense amplifier architecture. Curves D are the voltages at the same three points with the two P-sense amplifier architecture of FIG. 3. Curves E are the corresponding voltages on the logic 0 column line. The curves show that the logic 1 and logic 0 voltages separate significantly faster and the logic 1 voltages reach a significantly higher level with the two P-sense amplifier architecture of the invention. For example, the voltage of the logic 1 column line in the architecture according to the invention at a time of about 48 nsec is already as high as what the logic 1 column line of the prior art reaches at about 76 nsec. Thus the architecture according to the invention is about 35% faster than the prior art architecture.

FIG. 16 shows a comparison of the DRAM access cycle between the prior art one P-sense architecture without the row line pump circuits 31 and the two P-sense amplifier architecture of the invention with the row line pump circuitry 31. Curve A is the voltage at the column decoder end on the high or logic 1 column line with the prior art one P-sense amplifier architecture, curve B is the voltage at the cell associated with the high or logic 1 column line with the prior art one P-sense amplifier architecture, while curve C is the voltage at the P-sense amplifier end on the high or logic 1 column line with the prior art one P-sense amplifier architecture. Curve D is the voltage at the cell associated with the high or logic 1 column line with the two P-sense amplifier architecture and a pumped row line, while curve E is the voltage on the high or logic 1 column line with the two P-sense architecture and pumped row line. Curves H are the corresponding voltages on the logic 0 column line. Curve F is the normal row line voltage, and curve G is the pumped row line voltage. The extensions of the curves into the precharge period, on the right in FIG. 16, can be used to compare the logic 1 and logic 0 margins of the two circuits, that is the difference between the reference voltage level that the column lines come to when they are shorted together in the precharge cycle and their ultimate values in the amplification cycle. The prior art 0's margin of 1.72 volts is shown at 150, while the 0's margin with the architecture of the invention using a pumped row line is shown as 2.24 volts at 151. The prior art 1's margin of 1.48 volts is shown at 152, while the 1's margin of the architecture of the invention with a pumped row line is shown as 2.2 volts at 153. The improvement is thus about 23% in the 0's margin and about 33% in the 1's margin. The margin improvement using the two P-sense amplifier architecture alone, without a pumped row line, is about 11% for the 0's margin and 17% for the 1's margin.

A feature of the invention is that the addition of a second P-sense amplifier to each column line pair in a memory array yields many immediate advantages and also leads to additional advantages when combined with new extended isolation timing designs and asymmetric access topologies.

A further feature of the invention is that a timing design which, during an access of the column line halves nearest the data port, continues the isolation of the amplifier from the column line halves distal from the data port through the P-sense amplifier cycle and into the precharge cycle, yields power saving advantages by itself, and also yields further advantages in combination with the dual P-sense amplifier design and new asymmetric access topologies. A related feature of the inventions that the advantages of the novel timing designs will ensue with any amplifier means 140 (FIG. 14), including just an N-sense amplifier, 116, a P-sense amplifier 110, both, any of the other amplifier combinations shown in the other embodiments, as well as other amplifiers used in the art.

An additional feature of the invention is that the new asymmetric access topology by itself tends to smooth out the voltage, current, and power curves in most memory architectures, and at the same also yields many additional advantages when combined with the dual P-sense amplifier feature and extended isolation timing designs. A related feature is that this feature retains its advantages with any amplifier means 140 as described above.

There has been described a novel row access topology for a memory array circuit which provides uniform power requirements from access cycle to access cycle and which has many other advantages. It should be understood that the particular embodiment shown in the drawings and described within this specification is for purposes of example and should not be construed to limit the invention which will be described in the claims below. Further, it is evident that those skilled in the art may now make numerous uses and modifications of the specific embodiment described, without departing from the inventive concepts. For example, now that it is seen to be advantageous to use an asymmetric access topology in integrated circuit memory arrays, other asymmetric topologies may be used. Further, the invention clearly applies to a variety of different amplifier architectures. The invention may also be used in other types of memory than those described. Or equivalent components or circuits can be substituted for the various components and circuits described. Additional features may be added. A greater or lesser number of parts may be used. Consequently, the invention is to be construed as embracing each and every novel feature and novel combination of features present in and/or possessed by the integrated circuit memory described.

What is claimed is:

1. An integrated circuit memory comprising:
   an array of memory cells arranged in a plurality of rows and columns;
   column decoder means for selecting a column to be addressed in said plurality of columns;

a first column line pair extending from said column decoder means and connecting memory cells coupled to said first column line pair, said first column line pair divided into a first pair of column line halves and a second pair of column line halves;

a second column line pair extending from said column line decoder means and connecting memory cells coupled to said second column line pair, said second column line pair divided into a third pair of column line halves and a fourth pair of column line halves;

input/output means for connecting said first and said second column lines pairs to a circuit external of said memory array;

a plurality of row lines, each row line connecting memory cells in a row;

row access means for providing a row access signal defining a first row access cycle and a second row access cycle;

timing signal generator means responsive to said row access signal for providing one or more amplifier timing signals, wherein said one or more amplifier timing signals are derived from said row access signal;

row decoder means responsive to said row access signal for addressing a row connected to a memory cell connected to said first pair of column line halves during said first row access cycle, for addressing a row connected to a memory cell connected to said second pair of column line halves during said second row access cycle, for addressing a row connected to a memory cell connected to said third pair of column line halves during said first row access cycle and for addressing a row connected to a memory cell connected to said fourth pair of column line halves during said second cycle; and first amplifier means responsive to one of said amplifier timing signals for amplifying a signal from a memory cell connected to said first pair of column line halves during said first row access cycle and for amplifying a signal from a memory cell connected to said second pair of column line halves during said second row access cycle, said first amplifier means drawing a first amount of power when amplifying said signal associated with said first pair of column line halves and a second amount of power different from said first amount of power when amplifying a signal from said second pair of column line halves;

second amplifier means responsive to one of said amplifier timing signals for amplifying a signal from a memory cell connected to said third pair of column line halves during said first row access cycle and for amplifying a signal from a memory cell connected to said fourth pair of column line halves during said second row access cycle, said second amplifier means drawing said second amount of power when amplifying a signal associated with said third pair of column line halves and drawing said first amount of power when amplifying a signal associated with said fourth pair of column line halves.

2. An integrated circuit memory as in claim 1 wherein:

said first amplifier means comprises a first N-sense amplifier and first isolation means for alternatively isolating said first N-sense amplifier from each of said first pair of column line halves and said second pair of column line halves; and said second amplifier means comprises a second N-sense amplifier and second isolation means for alternatively isolating said second N-sense amplifier from each of said third pair of column line halves and said fourth pair of column line halves.

3. An integrated circuit memory as in claim 2 wherein:

said first amplifier means further comprises a first P-sense amplifier connected to said first pair of column line halves and a second P-sense amplifier connected to said second pair of column line halves; and said second amplifier means further comprises a third P-sense amplifier connected to said third pair of column line halves and a fourth P-sense amplifier connected to said fourth pair of column line halves.

4. An integrated circuit memory as in claim 2 wherein:

said first isolation means comprises a first isolation transistor connecting said first N-sense amplifier to said first pair of column line halves and a second isolation transistor connecting said first N-sense amplifier to said second pair of column line halves;

said second isolation means comprises a third isolation transistor connecting said second N-sense amplifier to said third pair of column line halves and a fourth isolation transistor connecting said second N-sense amplifier to said fourth pair of column line halves;

said first amplifier means further comprises a first P-sense amplifier connected to said first column line pair between said first isolation transistor and said second isolation transistor; and said second amplifier means further comprises a second P-sense amplifier connected to said second column line pair between said third isolation transistor and said fourth isolation transistor.

5. An integrated circuit memory as in claim 1 wherein said input/output means is connected to said second pair of column line halves and to said third pair of column line halves.

6. An integrated circuit memory as in claim 5 wherein there are a plurality of said first and second column lines pairs, each first column line pair is divided into a first pair of column line halves and a second pair of column line halves, each second column line pair is divided into a third pair of column line halves and a fourth pair of column line halves, said input/output means comprises said column decoder means connected to each of the second pair of column line halves and each of the third pair of column line halves, each first column line pair has associated with it one of said first amplifier means, and each second column line pair has associated with it one of said second amplifier means.

7. An integrated circuit memory as in claim 1 wherein said input/output means comprises a first SAM connected to said first pair of column line halves and a second SAM connected to said fourth pair of column line halves.

8. An integrated circuit memory as in claim 7 wherein there are a plurality of said first column line pairs and said second column line pairs, each first column line pair is divided into a first pair of column line halves and a second pair of column line halves, each second column line pair is divided into a third pair of column line halves and a fourth pair of column line halves, said input/output means comprises said a first SAM connected to each of said first pair of column line halves and a second SAM connected to each of said fourth pair of column line halves, each first column line pair has associated with it one of said first of said first amplifier means, and each second column line pair has associated with it one of said second amplifier means.

9. An integrated circuit memory comprising:
an array of memory cells arranged in a plurality of rows and at least one column;
a first column line pair connecting memory cells in a column, said first column line pair divided into a first pair of column line halves and a second pair of column line halves; a second column line pair connecting memory cells in a column, said second column line pair divided into a third pair of column line halves and a fourth pair of column line halves;
input/output means for connecting said first and second column lines pairs to a circuit external of said memory array, said input/output means connected to said second pair of column line halves and to said third pair of column line halves;
a plurality of row lines, each row line connecting memory cells in a row;
row access means for providing a row access signal defining a first row access cycle and a second row access cycle;
timing signal generator means responsive to said row access signal for providing one or more isolation timing signals, wherein said isolation timing signals are derived from said row access signal;
row decoder means responsive to said row access signal for addressing a row connected to a memory cell connected to said first pair of column line halves during said first row access cycle, for addressing a row connected to a memory cell connected to said second pair of column line halves during said second row access cycle, for addressing a row connected to a memory cell connected to said third pair of column line halves during said first row access cycle, and for addressing a row connected to a memory cell connected to said fourth pair of column line halves during said second row access cycle;
a first N-sense amplifier connected to said first column line pair;
a second N-sense amplifier connected to said second column line;
first isolating means responsive to said one of said isolation timing signals for isolating said first N-sense amplifier from said first pair of column line halves during at least a portion of said second row access cycle, said first N-sense amplifier connected to said first pair of column line halves through said first isolating means;
second isolating means responsive to one of said isolation timing signals for isolating said first N-sense amplifier from said second pair of column line halves during at least a portion of said first row access cycle, said first N-sense amplifier connected to said second pair of column line halves through said second isolating means;
third isolating means responsive one of said isolation timing signals for isolating said second N-sense amplifier from said third pair of column line halves during at least a portion of said second row access cycle, said second N-sense amplifier connected to said third pair of column line halves through said third isolating means; and
fourth isolating means responsive to one of said isolation timing signals for isolating said second N-sense amplifier from said fourth pair of column line halves during at least a portion of said first row access cycle said second N-sense amplifier connected to said fourth pair of column line halves through said fourth isolating means.

10. An integrated circuit memory as in claim 9 and further comprising:
a first P-sense amplifier connected to said first pair of column line halves;
a second P-sense amplifier connected to said second pair of column line halves;
a third P-sense amplifier connected to said third pair of column line halves; and
a fourth P-sense amplifier connected to said fourth pair of column line halves; and wherein:
said first isolating means comprises means for isolating said second P-sense amplifier from said first pair of column line halves during at least a portion of said second row access cycle; and
said fourth isolating means comprises means for isolating said third P-sense amplifier from said fourth pair of column line halves during at least a portion of said first row access cycle.

11. An integrated circuit memory as in claim 10 wherein there are a plurality of said first and second column lines, each first column line pair is divided into a first pair of column line halves and a second pair of column line halves, each second column line is divided into a third pair of column line halves and a fourth pair of column line halves, said input/output means comprises a column decoder connected to each of the second pair of column line halves and to each of said third pair of column line halves, each first column line pair having associated with it one of said first N-sense amplifiers, one of said first isolating means, one of said second isolating means, one of said first P-sense amplifiers, and one of said second P-sense amplifiers, and each second column line having associated with it one of said second means amplifiers, one of said third isolating means, and one of said fourth isolating means, one of said third P-sense amplifiers and one of said fourth P-sense amplifiers.

12. An integrated circuit memory comprising:
an array of memory cells arranged in a plurality of rows and columns;
a first column line pair of connecting memory cells in a column, said first column line pair divided into a first pair of column line halves and a second pair of column line halves;
a second column line connecting memory cells in a column, said second column line divided into a third pair of column line halves and a fourth pair of column line halves;
input/output means for connecting said column lines to a circuit external of said memory array, said input/output means connected to said second pair of column line halves and to said third pair of column line halves;
a plurality of row lines, each row line connecting memory cells in a row;
timing signal generator means for providing a timing signal defining a first time period and a second time period;

row decoder means connected to said timing signal generator means for addressing a row connected to a memory cell connected to said first pair of column line halves during said first time period, for addressing a row connected to a memory cell connected to said second pair of column line halves during said second time period, for addressing a row connected to a memory cell connected to said third pair of column line halves during said first time period, and for addressing a row connected to a memory cell connected to said fourth pair of column line halves during said second time period;

a first P-sense amplifier connected to said first pair of column line halves;

a second P-sense amplifier connected to said second pair of column line halves;

a third P-sense amplifier connected to said third pair of column line halves;

a fourth P-sense amplifier connected to said fourth pair of column line halves; and first isolating means responsive to said timing signal generator means for isolating said second P-sense amplifier from said first pair of column line halves during at least a portion of said second time period; and second isolating means responsive to said timing signal generator means for isolating said third P-sense amplifier from said fourth pair of column line halves during at least a portion of said first time period.

13. An integrated circuit memory as in claim 12 wherein there are a plurality of said first column line pairs and said second column line pairs, each first column line pair is divided into a first portion and a second portion, each second column line is divided into a third portion and a fourth portion, said input/output means comprises a column decoder connected to the each of said second pair of column line halves and third pair of column line halves, each first column line pair having associated with it one of said first P-sense amplifiers, one of said second P-sense amplifiers, and one of said first isolating means, and each second column line having associated with it one of said third P-sense amplifiers one of said fourth P-sense amplifiers, and one of said second isolating means.

14. An integrated circuit memory comprising:
an array of memory cells arranged in a plurality of rows and columns;
a first column line pair comprising a first column line connecting memory cells in one column and a second column line connecting memory cells in an adjacent column, said first column line pair divided into a first pair of column line halves and a second pair of column line halves;
a second column line pair comprising a third column line connecting memory cells in one column and a fourth column line connecting memory cells in an adjacent column, said second column line pair divided into a third pair of column line halves and a fourth pair of column line halves;
input/output means for connecting said column line pairs to a circuit external of said memory array;
a plurality of row lines, each row line connecting memory cells in a row;
row access means for providing a row access signal defining a first row access cycle and a second row access cycle;

timing signal generator means responsive to said row access signal for providing one or more amplifier timing signals, wherein said amplifier timing signals are derived from said row access signal;

row decoder means responsive to said row access signal for addressing a row connected to a memory cell connected to said first pair of column line halves during said first row access cycle, for addressing a row connected to a memory cell connected to said second pair of column line halves during said second row access cycle, for addressing a row connected to a memory cell connected to said third pair of column line halves during said first row access cycle, and for addressing a row connected to a memory cell connected to said fourth pair of column line halves during said second row access cycle; and first amplifier means responsive to one of said amplifier timing signals for amplifying a signal from a memory cell connected to said first pair of column line halves during said first row access cycle and for amplifying a signal from a memory cell connected to said second pair of column line halves during said second row access cycle, said first amplifier means drawing a first amount of power when amplifying said signal associated with said first pair of column line halves and as second amount of power different from said first amount of power when amplifying a signal from said second pair of column line halves;

second amplifier means responsive to one of said amplifier timing signals for amplifying a signal from a memory cell connected to said third pair of column line halves during said first row access cycle and for amplifying a signal from a memory cell connected to said fourth pair of column line halves during said second row access cycle, said second amplifier means drawing said second amount of power when amplifying a signal associated with said third pair of column line halves and drawing said first amount of power when amplifying a signal associated with said fourth pair of column line halves.

15. An integrated circuit memory as in claim 14 wherein:
said first amplifier means comprises a first N-sense amplifier and first isolation means for alternatively isolating said first N-sense amplifier from each of said first and second pair of column line halves of said first column line pair; and
said second amplifier means comprises a second N-sense amplifier and second isolation means for alternatively isolating said second N-sense amplifier from each of said third and fourth pair of column line halves of said second column line pair.

16. An integrated circuit memory as in claim 15 wherein said first amplifier means further comprises a first P-sense amplifier connected to said first pair of column line halves and a second P-sense amplifier connected to said second pair of column line halves; and said second amplifier means further comprises a third P-sense amplifier connected to said third pair of column line halves and a fourth P-sense amplifier connected to said fourth pair of column line halves.

17. An integrated circuit memory as in claim 15 wherein:
said first isolation means comprises a first pair of isolation transistors connecting said first N-sense amplifier to said first pair of column line halves, a second pair of isolation transistors connecting said first N-sense amplifier to said second pair of column line halves;

said second isolation means comprises a third pair of isolation transistors connecting said second N-sense amplifier to said third pair of column line halves, and a fourth pair of isolation transistors connecting said second N-sense amplifier to said fourth pair of column line halves;

said first amplifier means further comprises a first P-sense amplifier connected across said first column line pair between said first pair of isolation transistors and said second pair of isolation transistors; and said second amplifier means further comprises a second P-sense amplifier connected to said second column line pair between said third pair of isolation transistors and said fourth pair of isolation transistors.

18. An integrated circuit memory as in claim 14 wherein said input/output means is connected to said second pair of column line halves and to said third pair of column line halves.

19. An integrated circuit memory as in claim 18 wherein there are a plurality of said first and second column line pairs, each first column line pair is divided into a first pair of column line halves and a second pair of column line halves, each second column line pair is divided into a third pair of column line halves and fourth pair of column line halves, said input/output means comprises a column decoder connected to the second pair of column line halves of each first column line pair and the third pair of column line halves of each second column line pair, each first column line pair has associated with it one of said first amplifier means, and each second column line pair has associated with it one of said second amplifier means.

20. An integrated circuit memory comprising:
an array of memory cells arranged in a plurality of rows and at least one column;
a first column line pair connecting memory cells in a column, said first column line pair divided into a first pair of column line halves and a second pair of column line halves;
a second column line connecting memory cells in a column, said second column line divided into a third pair of column line halves and a fourth pair of column line halves;
input/output means for connecting said first and second column lines to a circuit external of said memory array, said input/output means connected to said second pair of column line halves and to said third pair of column line halves;
a plurality of row lines, each row line connecting memory cells in a row;
row access means for providing a row access signal defining a first row access cycle and a second row access cycle;
row decoder means responsive to said row access signal for addressing a row connected to a memory cell connected to said first pair of column line halves during said first row access cycle, for addressing a row connected to a memory cell connected to said second pair of column line halves in said second row access cycle, for addressing a row connected to a memory cell connected to said third pair of column line halves during said first row access cycle, and for addressing a row connected to a memory cell connected to said fourth pair of column line halves during said second row access cycle;

a first P-sense amplifier connected to said first pair of column line halves;
a second P-sense amplifier connected to said second pair of column line halves;
a third P-sense amplifier connected to said third pair of column line halves;
a fourth P-sense amplifier connected to said fourth pair of column line halves;
timing signal generator means responsive to said row access signal for providing a refresh timing signal defining a refresh period, a first P-sense timing signal defining a P-sense period during said first row access cycle, a second P-sense timing signal defining a P-sense period during said second row access cycle, and one or more isolation timing signals, wherein said isolation timing signals are derived from said row access signal;
first isolating means responsive to one of said isolation timing signals for isolating said first pair of column line halves from said second pair of column line halves during said P-sense period in said second row access cycle during said refresh period;
second isolating means responsive to one of said isolation timing signals for isolating said second pair of column line halves from said first pair of column line halves during said P-sense period in said first row access cycle during said refresh period;
third isolating means responsive to one of said isolation timing signals for isolating said third pair of column line halves from said fourth pair of column line halves during said P-sense period in said second row access cycle during said refresh period; and
fourth isolating means responsive to one of said isolation timing signals for isolating said fourth pair of column line halves from said third pair of column line halves during said P-sense period in said first row access cycle during said refresh period.

21. An integrated circuit memory as in claim 20 and further comprising a first N-sense amplifier connected to said first column line pair between said first isolating means and said second isolating means and a second N-sense amplifier connected to said second column line pair between said third isolating means and said fourth isolating means.

22. An integrated circuit memory comprising:
an array of memory cells arranged in a plurality of rows and at least one column;
a first column line pair connected memory cells in a column, said first column line pair divided into a first pair of column line halves and a second pair of column line halves;
a second column line pair connecting memory cells in a column, said second column line pair divided into a third pair of column line halves and a fourth pair of column line halves;
input/output means for connecting said first and second column line pairs to a circuit external of said memory array, said input/output means connected to said first pair of column line halves and to said fourth pair of column line halves;
a plurality of row lines, each row line connecting memory cells in a row;

row access means for providing a row access signal defining a first row access cycle and a second row access cycle;

timing signal generator means responsive to said row access signal for providing one or more isolation timing signals, wherein said isolation timing signals are derived from said row access signal;

row decoder means responsive to said row access signal for addressing a row connected to a memory cell connected to said first pair of column line halves during said first row access cycle, for addressing a row connected to a memory cell connected to said second pair of column line halves during said second row access cycle, for addressing a row connected to a memory cell connected to said third pair of column line halves during said first row access cycle, and for addressing a row connected to a memory cell connected to said fourth pair of column line halves during said second row access cycle;

a first N-sense amplifier connected to said first column line pair;

a second N-sense amplifier connected to said second column line pair;

first isolating means responsive to said one of said isolation timing signals for isolating said first N-sense amplifier from said first pair of column line halves during at least a portion of said second row access cycle, said first N-sense amplifier connected to said first pair of column line halves through said first isolating means;

second isolating means responsive to one of said isolation timing signals for isolating said first N-sense amplifier from said second pair of column line halves during at least a portion of said first row access cycle, said first N-sense amplifier connected to said second pair of column line halves through said second isolating means;

third isolating means responsive one of said isolation timing signals for isolating said second N-sense amplifier from said third pair of column line halves during at least a portion of said second row access cycle, said second N-sense amplifier connected to said third pair of column line halves through said third isolating means; and fourth isolating means responsive to one of said isolation timing signals for isolating said second N-sense amplifier from said fourth pair of column line halves during at least a portion of said first row access cycle said second N-sense amplifier connected to said fourth pair of column line halves through said fourth isolating means.

23. An integrated circuit memory as in claim 22 and further comprising:

a first P-sense amplifier connected to said first pair of column line halves;

a second P-sense amplifier connected to said second pair of column line halves;

a third P-sense amplifier connected to said third pair of column line halves; and a fourth P-sense amplifier connected to said fourth pair of column line halves; and wherein:

said second isolating means comprises means for isolating said first P-sense amplifier from said second pair of column line halves during at least a portion of said first row access cycle; and said third isolating means comprises means for isolating said fourth P-sense amplifier from said third pair of column line halves during at least a portion of said second row access cycle.

24. An integrated circuit memory as in claim 22 wherein said input/output means comprises a first SAM port connected to said first pair of column line halves and a second SAM port connected to said fourth pair of column line halves.

* * * * *